(12) United States Patent
Andersson

(10) Patent No.: US 8,127,199 B2
(45) Date of Patent: Feb. 28, 2012

(54) SDRAM CONVOLUTIONAL INTERLEAVER WITH TWO PATHS

(75) Inventor: Jorgen Andersson, San Jose, CA (US)

(73) Assignee: RGB Networks, Inc., Sunnyvale, CA (US)

( * ) Notice: Subject to any disclaimer, the term of this patent is extended or adjusted under 35 U.S.C. 154(b) by 1355 days.

(21) Appl. No.: 11/787,228

(22) Filed: Apr. 13, 2007

(65) Prior Publication Data

US 2008/0256417 A1    Oct. 16, 2008

(51) Int. Cl.
H03M 13/00    (2006.01)

(52) U.S. Cl. .................................. 714/762; 714/788

(58) Field of Classification Search .............. 714/762, 714/788
See application file for complete search history.

(56) References Cited

U.S. PATENT DOCUMENTS

| | | | |
|---|---|---|---|
| 5,261,068 A | | 11/1993 | Gaskins et al. |
| 5,576,707 A | * | 11/1996 | Zook ................... 341/58 |
| 5,761,695 A | | 6/1998 | Maeda et al. |
| 6,055,277 A | * | 4/2000 | Stephens et al. ........... 375/285 |
| 6,484,283 B2 | * | 11/2002 | Stephen et al. ............ 714/786 |
| 6,564,304 B1 | | 5/2003 | Van Hook et al. |
| 6,928,024 B2 | * | 8/2005 | Pfeiffer et al. ........... 365/230.03 |
| 7,051,171 B1 | | 5/2006 | Liu et al. |
| 7,124,240 B2 | | 10/2006 | Peters |
| 2003/0084398 A1 | * | 5/2003 | Nguyen .................... 714/786 |
| 2003/0095126 A1 | | 5/2003 | Dean |
| 2005/0063421 A1 | * | 3/2005 | Wan et al. ................. 370/509 |
| 2005/0195679 A1 | * | 9/2005 | Faue et al. ................. 365/233 |
| 2007/0022358 A1 | | 1/2007 | Chen |

OTHER PUBLICATIONS

"Memory Evolution or Revolution?", [online], [retrieved on Nov. 2, 2006], Retrieved from the DEW Associates Corporation website using Internet <URL:http://www.dewassoc.com/performance/memory/intro_3.htm>.

* cited by examiner

Primary Examiner — Guy Lamarre
(74) Attorney, Agent, or Firm — Lipsitz & McAllister, LLC

(57) ABSTRACT

An SDRAM convolutional interleaver with two paths. Symbols are assigned to a given one of the two paths, then are sorted to minimize (to one) a number of breaks in a sequential Interleaver write address. After sorting, the symbols are stored staggered in SRAM and burst written to SDRAM. Before writing to SDRAM, data is accumulated for four symbols at a time, and the data is written four symbols wide to optimize SDRAM access time. 8 bit symbols are written 32 bits at a time to SDRAM.

17 Claims, 12 Drawing Sheets

Data Flow

Convolutional Interleaver i=8..128 j=16..[1..8]

Data Flow

AB_Sorter

Packer for I,J=128,1

Packer for I,J=128,3

SDRAM for I,J=128,1

SDRAM for I,J=128,3

UnPacker

AB_UnSorter

SDRAM CONVOLUTIONAL INTERLEAVER WITH TWO PATHS

TECHNICAL FIELD OF THE INVENTION

The invention relates to data communications, more particularly to error correction techniques and, more particularly to convolutional interleaving.

BACKGROUND OF THE INVENTION

The world is going digital. Cell phone communications are an example of digital signal communications, and satellite broadcasts are typically digital. Many wired telephone connections are still analog, as are most television broadcasts, but it not inconceivable that these medium will also move towards digital, and analog signals for communication will largely be a thing of the past.

In parallel with the "digital revolution", the world is going wireless. Cell phones are an example of wireless communication.

The whole field of digital communications has spawned several areas of specialty and expertise, including error detection and correction techniques, to name a few.

"Coding" is a term that often shows up in any discussion of digital signal processing. Generally, coding may refer to converting an analog signal (such as a movie image) into a digital format (ones and zeroes). Thus, for example, a motion picture which is originally on film (an analog format) can be converted to a data file (digital format) such as by "MPEG" encoding. When it is desired to view the MPEG-encoded film (and it should be understood that our eyes respond to analog images), the data file must be "de-coded", returned to its original analog format.

"Coding" may also refer to taking a digital signal which is already in one digital format, and changing it to another digital format so as to be suitable for a particular purpose, such as storage or transmission over a given medium. For example, an original CD wave file can be trans-coded (or compressed) to another format, such as MP3, resulting in a smaller data file (for example 3 MByte rather than 30 MByte).

Error Detection and Correction

Generally, "error detection" is the ability to detect errors that are made due to noise or other impairments in the course of the transmission from the transmitter to the receiver, and "error correction" is the ability to correct errors at the receiver.

Data being sent (transmitted), whether over a wired connection or a wireless connection, is typically arranged into packets or blocks having a prescribed size, and an error correction code is often generated and sent along with the packet or block. At the receiving end, the received data can be compared against the error correction code to determine whether the data contained within the packet became corrupted. In some cases, using forward error correction (FEC), the corrupted data can be corrected. In other cases, the receiving station can signal the transmitting station that corrupt data was received, with a request to re-transmit the data. (In yet other cases, corrupted data may simply be ignored.)

Error-correcting codes can be divided into block codes and convolutional codes. Other block error-correcting codes, such as Reed-Solomon codes transform a chunk of bits into a (longer) chunk of bits in such a way that errors up to some threshold in each block can be detected and corrected. However, in practice errors often occur in bursts rather than at random. This is often compensated for by shuffling (interleaving) the bits in the message after coding. Then any burst of bit-errors is broken up into a set of scattered single-bit errors when the bits of the message are unshuffled (de-interleaved) before being decoded.

One feature of an error correction scheme may be to organize data in such a way that errors, as are to be expected, can successfully be dealt with. Interleaving is a way of arranging data in such a way that error correction schemes can successfully be applied to corrupt data to recover the original data from corrupted data.

Interleaving

Interleaving involves re-arranging data in a non-contiguous way in order to increase performance. Interleaving is mainly used in data communication, multimedia file formats, radio transmission (for example in satellites) or by ADSL (asymmetrical digital subscriber link). Historically, interleaving has also been used in ordering block storage on hard disks. The term "multiplexing" is sometimes used to refer to the interleaving of digital signal data.

Today, interleaving is mainly used in digital data transmission technology, to protect the transmission against "burst errors". Burst errors overwrite (corrupt, alter) several bits in a row, but seldom occur. Interleaving is used to address/solve this problem.

All data is transmitted with some control bits (independently from the interleaving), such as error correction bits, that enable the channel decoder to correct a certain number of altered bits. If a burst error occurs, and more than this number of bits is altered, the codeword cannot be correctly decoded. So the bits of a number of codewords are "interleaved" and then transmitted. That way, a burst error affects only a correctable number of bits in each codeword, so the decoder can decode the codewords correctly.

For example, an error correcting code is applied so that a channel codeword has four bits and one-bit errors can be corrected. The channel codewords are put into a block like this: aaaabbbbccccddddeeeeffffgggg (the block comprises seven 4-bit codewords: a, b, c, d, e and f)

Transmitted without interleaving, the received signal should be (error-free transmission):

aaaabbbbccccddddeeeeffffgggg

However, a burst error could corrupt a number of contiguous bits of the transmitted data so that the received signal looks like this:

aaaabbbbccc_deeeeffffgggg

In this example, the codeword "cccc" is altered in one bit (the fourth c is missing), and can be corrected. However, the codeword "dddd" is altered in three bits (the first three d's are missing). It is possible that it cannot be decoded (decoding failure) or might be decoded into a wrong codeword (false decoding). Which of the two happens depends on the error correcting code applied.

Burst error, by definition, typically corrupts a sequence of bits, as in the previous example, which may completely wipe out a particular codeword, or at least corrupt sufficient bits of the codeword that it cannot be corrected.

Interleaving, generally, requires re-arranging the bits of the codewords—spreading them out, so to speak—so that anticipated burst errors can be corrected.

Consider the following example, wherein the first of the four bits of each of the seven codewords (a1,b1,c1,d1,e1,f1,g1) are transmitted, then the second bits of each of the seven codewords (a2,b2,c2,d2,e2,f2,g2) are transmitted, then the seven third bits (a3,b3,c3,d3,e3,f3,g3), then the seven fourth bits (a4,b4,c4,d4,e4,f4,g4). This is called "interleaving". (At the receiving end, the interleaved/re-arranged bits must be put back into their original order—this is called "de-interleaving").

The transmitted signal (with interleaving) should look like (error-free transmission):

abcdefgabcdefgabcdefgabcdefg (More detailed, the transmission looks like this: a1,b1,c1, d1,e1,f1,g1, a2,b2,c2,d2,e2,f2,g2, a3,b3,c3,d3,e3,f3,g3, a4,b4,c4,d4,e4,f4,g4)

However, a burst error could corrupt the data so that the signal looks like this:

abcdefgabcd_bcdefgabcdefg

Here, as in the previous example, four contiguous bits are missing, in this case the second e, f, and g bits (e2,f2,g2), and the third a bit (a3).

And, the de-interleaved transmission with the above burst error would look like this:

aa_abbbbccccddde_eef_ffg_gg

In each of the codewords aaaa, eeee, ffff, gggg only one bit is altered, so a one-bit-error-correcting-code can decode everything correctly.

Of course, all this interleaving requires computational overhead, and that is the general topic of the present invention—namely, techniques related to interleaving and de-interleaving.

Convolutional Interleavers

A convolutional interleaver generally consists of a set of shift registers, each with a fixed delay. In a typical convolutional interleaver, the delays are nonnegative integer multiples of a fixed integer (although a general multiplexed interleaver allows arbitrary delay values). Each new symbol from the input signal feeds into the next shift register and the oldest symbol in that register becomes part of the output signal.

Convolutional interleavers and de-interleavers are commonly employed in a FEC scheme to protect against a burst of errors from being sent to a block decoder, such as a Reed-Solomon decoder. It is well known that interleaving techniques improve error correction capability.

FIG. 1 is a simplified schematic block diagram illustrating a typical convolutional interleaver and deinterleaver, according to the prior art. In many applications, interleaved data are buffered using static random access memory (SRAM). The width of data to be stored into the memory matches the interleaver/deinterleaver symbol size. For the interleaver 100, each successive branch (102, 103, . . . , 109) has J more symbols than the immediately preceding branch. For example, branch 103 has J more symbols than branch 102.

To the contrary, for the deinterleaver 120, each successive branch (102', 103', 104', . . . , 109') has J fewer symbols than the immediately preceding branch. For example, branch 103' has J fewer symbols than branch 102'. Unless indicated otherwise, "I" represents the interleaving depth and "J" represents the interleaving increment. Thus, one branch has a different delay from another branch. The foregoing characteristic, i.e., the delay difference, thus creates sequential-write addresses and non-sequential-read addresses, or vice versa, when conventional memory access is used. This asymmetry between write and read addresses affects data throughput. Furthermore, another problem associated with SRAM is that SRAM is relatively more expensive than other types of memory, such as, synchronous dynamic random access memory (SDRAM).

In some applications, SDRAM is used to store interleaved data. However, use of SDRAM based on the interleaving/deinterleaving approach described above also has its disadvantages. For example, one disadvantage is that by using conventional SDRAM access, the overhead ACTIVE and PRECHARGE command cycles for non-sequential read or write addresses significantly reduce data throughput. Another disadvantage is that when conventional SDRAM is used, some applications may not have enough bandwidth to satisfy the requirement that the data width associated with the memory needs to be equal to the symbol size.

Data Communications Systems

FIG. 2 depicts a typical prior art communication system including a transmitter 210 for converting an input data sequence TX into an outgoing analog signal V1 transmitted through a communication channel 214 to a receiver 212. Receiver 212 converts signal V2 back into an output data sequence RX matching the transmitters' incoming data sequence TX. Since channel 214 can introduce random noise into signal V2, it is possible that some of the bits of the RX sequence will not match corresponding bits of the TX sequence. To reduce the likelihood that noise in channel 214 will produce errors in the RX sequence, transmitter 210 includes a forward error correction (FEC) encoder 216, such as for example a Reed-Solomon encoder, for encoding the incoming data sequence TX into a sequence A of N-byte words. Each word of sequence A "over-represents" a corresponding portion of the TX sequence because it contains redundant data. A convolutional interleaver 218 interleaves bytes of successive words of word sequence A to produce an output word sequence B supplied to a modulator 220. Modulator 220 generates signal V1 to represent successive bytes of word sequence B.

A demodulator 222 within receiver 212 demodulates signal V2 to produce a word sequence B'. Word sequence B' will nominally match the word sequence B input to the transmitter's modulator 220, though some of the bytes forming word sequence B' may include bit errors caused by noise in channel 214. A deinterleaver circuit 224 deinterleaves word sequence B' to produce a word sequence A' nominally matching word sequence A, although it too may include errors resulting from the errors in word sequence B'. An FEC decoder 226 then decodes word sequence A' to produce the output data sequence RX.

Although the A' sequence may contain some errors, it is possible for FEC decoder 226 to produce an outgoing sequence RX matching the TX sequence because words of the A' sequence contain redundant data. When a portion of an A' sequence word representing any particular portion of the RX data is corrupted due to an error in the B' sequence, another redundant portion of the A' sequence word also representing that particular portion of the RX sequence may not be corrupted. FEC decoder 226 is able to determine which portions of each A' sequence word are not corrupted and uses the uncorrupted portions of those words as a basis for determining bit values of its corresponding portion the RX sequence. Each possible FEC scheme will have a limited capability for correcting byte errors. For example, a (255, 16) Reed-Solomon code, including 16 bytes of redundant data to form a 255 bytes code word can correct up to 8 byte errors, but no more.

It is possible for some portion of the RX sequence to contain an error when there are excessive errors within an A' sequence word representing that particular portion of the RX sequence, but interleaver 218 and deinterleaver 224 help to reduce the chances of that happening. Since noise in channel 14 can occur in bursts that may persist long enough to corrupt portions of signal V1 conveying every byte of a B' sequence word, interleaver 218 improves the system's noise immunity by interleaving bytes of successive words of sequence A to produce word sequence B. Since each word of sequence A produced by FEC encoder 216 contains redundant data describing a particular section of the TX sequence, interleaving the words of sequence A to produce words of sequence B has the effect of spreading out information conveyed by signal V1 so that a single noise burst in channel 214 is less likely to corrupt an excessive number of bytes of information representing the same portion of the TX sequence.

FIG. 3 is another diagram of a communications system comprising a convolutional interleaver. The ITU Forward Error Correction (FEC) definition is composed of four processing layers, as illustrated in FIG. 3. There are no dependencies on input data protocol in any of the FEC layers. FEC synchronization is fully internal and transparent. Any data sequence will be delivered from the encoder input to decoder output.

The FEC section uses various types of error correcting algorithms and interleaving techniques to transport data reliably over the cable channel.

Reed-Solomon (RS) Coding—Provides block encoding and decoding to correct up to three symbols within an RS block.

Interleaving—Evenly disperses the symbols, protecting against a burst of symbol errors from being sent to the RS decoder.

Randomization—Randomizes the data on the channel to allow effective QAM demodulator synchronization.

Trellis Coding—Provides convolutional encoding and with the possibility of using soft decision trellis decoding of random channel errors.

With regard to interleaving, interleaving is included in the modem between the RS block coding and the randomizer to enable the correction of burst noise induced errors. In both 64-QAM and 256-QAM a convolutional interleaver is employed.

Convolutional interleaving is illustrated in FIG. B.8 of the ITU document. At the start of an FEC frame defined in a subsequent subclause, the interleaving commutator position is initialized to the top-most branch and increments at the RS symbol frequency, with a single symbol output from each position. With a convolutional interleaver, the RS code symbols are sequentially shifted into the bank of I registers (the width of each register is 7 bits which matches the RS symbol size). Each successive register has J symbols more storage than the preceding register. The first interleaver path has zero delay, the second has a J symbol period of delay, the third 2*J symbol periods of delay, and so on, up to the Ith path which has (I−1)*J symbol periods of delay. This is reversed for the de-interleaver in the Cable Decoder such that the net delay of each RS symbol is the same through the interleaver and de-interleaver. Burst noise in the channel causes a series of bad symbols. These are spread over many RS blocks by the de-interleaver such that the resultant symbol errors per block are within the range of the RS decoder correction capability.

Related Patents and Publications

Reference is made to ITU-T Recommendation J.83 (Digital multi-program systems for television, sound and data services for cable distribution), Section B.5.2 Page 21 (4/97), hereinafter referred to as "ITU Specification", incorporated by reference in its entirety herein.

US Patent Publication No. 2005/0063421 ("Wan"), incorporated by reference in its entirety herein, discloses convolutional interleaver and deinterleaver. As disclosed therein, an interleaver or deinterleaver convolutionally interleaves or deinterleaves an incoming word sequence to form an outgoing word sequence. The interleaver or deinterleaver includes an external memory read and write accessed by a direct memory access (DMA) controller for storing bytes forming words of the incoming word sequence until the bytes are needed to form words of the outgoing sequence. The interleaver uses a cache memory to store bytes of a next set of outgoing sequence words. The interleaver initially writes bytes of each incoming word to the external memory and also writes some bytes of the incoming words directly to the cache memory when they are to form parts of the outgoing sequence words currently stored in the cache memory. The interleaver transfers bytes from the main memory to the cache memory when the bytes are needed to form a next set of output sequence words. The deinterleaver stores bytes of incoming words in its cache memory until the cache memory is filled and then DMA transfers them to the external memory. The deinterleaver forms words of the output sequence from bytes it obtains from both its cache memory and its external memory.

Wan discloses a number of Interleavers, more particularly, FIG. 3 of Wan illustrates a prior art interleaver 18 including a controller 28, an input buffer 30, a static random access memory (SRAM) 32 and an output buffer 34 all of which may be implemented on the same integrated circuit (IC) 35. FEC encoder 16 (Wan FIG. 1) writes successive bytes of each successive word of sequence A into input buffer 30, and whenever it has written an entire word of sequence A into buffer 30 it pulses an INPUT_READY input signal to controller 28. Controller 28 responds to the INPUT_READY signal by writing each byte of the sequence A word in buffer 30 to a separate address of SRAM 32. Controller 28 then sequentially reads each byte that is to form a next word of sequence B out of SRAM 32, stores it in output buffer 34 and then sends an OUTPUT_READY signal to modulator 20 (Wan FIG. 1) telling it that it may read a next word of sequence B out of output buffer 34.

The algorithm controller 28 employed for producing read and write addresses for SDRAM 32 ensures that each incoming word of sequence A into SRAM 32 overwrites a previous word of sequence A that is no longer needed and ensures that bytes forming words of sequence B are read in the proper order. To interleave N-byte words of incoming sequence A with an interleaving depth D, SRAM 32 must have D×N addressable byte storage locations. The interleaver architecture illustrated in Wan FIG. 3 is typically employed when interleaver 18 can be implemented on a single IC 35, but when N×D is large it becomes impractical to embed a sufficiently large SDRAM 32 in a single IC.

Wan FIG. 4 illustrates another prior art architecture for an interleaver 18' including a controller 28', an input buffer 30' and an output buffer 34' included within a single IC 35'. Interleaver 18' employs an external synchronous dynamic random access memory (SDRAM) 36 for storing bytes rather than an internal SRAM. While controller 28 of Wan FIG. 3 can directly read and write accesses each byte of SRAM 32, controller 28' of Wan FIG. 4 can only access data in SDRAM 36 via a direct memory access (DMA) controller 38. Rather than individually read and write accessing each byte stored in SDRAM 36, DMA controller 38 operates in a "burst" mode wherein it read or write accesses bytes stored at several (typically 16) successive addresses. Thus when controller 28' wants to obtain particular bytes stored in SDRAM 36 to write into output buffer 34', it must ask DMA controller 38 to read a block of bytes including the particular bytes needed to form the next output sequence word. Controller 28' then transfers those particular bytes to output buffer 34'. However since bytes are not addressed in SDRAM in the order in which they are needed to from bytes of the outgoing word sequence, many of the bytes DMA controller 38 reads from SDRAM 36 during each DMA read access will be discarded.

Since SDRAMs are relatively inexpensive, it can be more cost effective for an interleaver or deinterleaver to employ the architecture of Wan FIG. 4 than that of Wan FIG. 3, particularly when a large amount of memory is needed. However since read and write access to an internal SRAM is typically faster than that of an external SDRAM, interleaver 18 of Wan FIG. 3 can have a higher throughput (in bytes per second) than interleaver 18' of Wan FIG. 4. The maximum throughput of the interleaver of FIG. 4 can be further limited because much of the bandwidth of SDRAM 36 is wasted reading bytes that are discarded.

Wan FIG. 5 depicts an example of a convolutional interleaver 39 in accordance with the invention including a controller 40, an input buffer 42, a direct memory access (DMA) controller 44, a multiplexer 48, a cache memory 50 and an output buffer 52 all of which are preferably implemented on a single integrated circuit (IC) chip 53. DMA controller 44 read and write accesses a "main" memory 46, suitably an SDRAM external to IC chip 53. Interleaver 39 convolutionally interleaves a sequence A of N-byte incoming words with an interleaving depth D ranging up to Dmax to form a sequence B of N-byte outgoing words. The number N of bytes in each incoming word and in each outgoing word may range up to a maximum number Nmax, such as for example 255. Controller 40 is suitably implemented as a programmable state machine so that the values of N and D can be selected by the manner in which controller 40 is programmed.

Main memory 46 suitably has a least Nmax×Dmax storage locations, with each addressable storage location sized to hold a single byte. DMA controller 44 operates in a burst read and write mode wherein it read or write accesses many successive addresses of main memory 46 whenever it read or write accesses main memory 46. Cache memory 50 preferably includes at least BurstLen×Dmax storage locations where BurstLen is the number (e.g. 16) of successive addresses DMA controller accesses during each burst mode read or write access (its "burst length"). Cache memory 50 can also store one byte at each of its addressable storage locations, but controller 40 can separately and independently read and write access each of its addressable storage locations.

Thus as described above, interleaver 39 uses main memory 46 for storing bytes only when the N×D exceeds the number of available storage locations in cache memory 50 and uses only cache memory 50 for storing bytes of incoming words until they are needed to form outgoing words. Otherwise, interleaver 39 uses main memory 46 for storing all input sequence words and uses cache memory 50 for storing bytes of only as many output sequence words as it can hold.

Cache memory 50 improves the efficiency of DMA read accesses of interleaver 39 compared to the prior art interleaver of Wan FIG. 4 because it reduces the number of bytes its DMA controller reads that have to be discarded. The DMA controller of the prior art interleaver of Wan FIG. 4 reads bytes that are to be included in several outgoing sequence words during each DMA read access, but only those bytes to be incorporated into the next outgoing sequence word are actually used; the rest of the bytes the DMA controller reads are discarded and must be read again at other times when they are actually needed to form a next output sequence word. Since the cache memory 50 of interleaver 39 of Wan FIG. 5 can hold bytes that are to form many outgoing sequence words, fewer of the bytes DMA controller 44 need be discarded. Cache memory 50 therefore reduces the frequency with which DMA controller 44 must read access main memory 46, thereby increasing the interleaver's available throughput.

U.S. Pat. No. 7,051,171 ("Liu"), incorporated by reference in its entirety herein, discloses method and system for providing a multi-channel interleaver/deinterleaver using SDRAM. A deinterleaver for performing high-speed multi-channel forward error correction using external SDRAM is provided. According to one exemplary aspect, the deinterleaver performs both read and write accesses to the SDRAM that are burst-oriented by hiding active and precharged cycles in order to achieve high data rate operations. The data bus length of the SDRAM is designed to be twice the deinterleaving symbol size thereby allowing bandwidth to be increased. The deinterleaver accesses data in the SDRAM as read blocks and write blocks. Each block includes a predetermined number of data words to be interleaved/deinterleaved. The ACTIVE command for one block is issued when a preceding block is being processed. Data in one read/write block has the same row address within the same bank of the SDRAM. More particularly, Liu FIG. 2 illustrates a simplified block diagram of a convolutional deinterleaver 21 according to one exemplary embodiment of the present invention. The convolutional deinterleaver 21 is implemented using an SDRAM 22. In this exemplary embodiment, the data or symbol size is eight (8) bits and the word size is sixteen (16) bits. (column 3, lines 16-21)

As shown in Liu FIG. 2, the input buffer 24 combines two symbols in the same branch of the deinterleaver 21 into a word. The delay between two symbols in the same branch is an integer multiple of the deinterleaving depth I. For each word, the input buffer 24 stores the first symbol until the second symbol of the word is received. When a predetermined number of words for one channel are stored in the input buffer 24, such words, collectively a write block as described further below, are forwarded to the SDRAM write buffer 30 for write processing. According to a preferred embodiment, the size of the input buffer 24 is no more than twice the interleaving depth I. A controller 28 generates a periodic address sequence for the incoming data 34 so that symbols $s(t)$ and $s(t+n*I)$ of one channel are combined to form a word, where n is an integer greater than zero (0). In an exemplary embodiment, n is equal to one (1). Based on the disclosure and teachings provided herein, a person of ordinary skill in the art will know and appreciate how to select the appropriate value for n. (column 3, lines 22-40)

Computer Memory, Generally

The present invention relates largely to efficiently and effectively utilizing computer memory, in the exemplary context of achieving certain goals in interleaving data, such as to accommodate forward error correction (FEC) techniques.

Generally speaking, there are two main forms of computer memory—volatile and non-volatile. Non-Volatile Memory (NVM) is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of a NVM memory cell is a simple light switch. Indeed, such a switch can be set to one of two (binary) positions, and "memorize" that position.)

Internally, computer memory is arranged as a matrix of "memory cells" in rows and columns, like the squares on a checkerboard. The entire organization of rows and columns is called an "array." Each memory cell is used to store one (or more) bit(s) of data which can be retrieved by indicating the data's row and column location.

Memory cells alone would be worthless without some way to get information in and out of them. So the memory cells have a whole support infrastructure of other specialized circuits. These circuits perform functions such as:

Identifying each row and column (row address select and column address select)

Keeping track of the refresh sequence (counter)

Reading and restoring the signal from a cell (sense amplifier)

Telling a cell whether it should take a charge or not (write enable)

Other functions of the memory controller include a series of tasks that include identifying the type, speed and amount of memory and checking for errors.

A few types of random access memory (RAM) are now briefly discussed, including SRAM, DRAM, SDRAM and DDR SDRAM, as follows:

SRAM: SRAM stands for Static Random Access memory. Basically a SRAM is an array of flip-flops which is addressable. The array can be configured as such that the data comes out in single bit, 4-bit, 8 bit, etc. . . . format. SRAM technology is volatile just like the flip-flop, its basic memory cell. SRAM has the advantage of being quite fast and simple. Because of that it is often used as a memory component in case the total amount of memory can be small. SRAM is often found on microcontroller boards, either on-or off the CPU-chip because for such applications the amount of memory required is small and it would not pay off to build the extra interface circuitry for DRAMs. Another application where often SRAM memory is found is for cache applications, because of the SRAM high memory speed.

DRAM: DRAM stands for Dynamic Random Access Memory. The word 'dynamic' indicates that the data is not held in a flip-flop but rather in a storage cell. The ugly thing about a storage cell is that is it leaks. Because of that, data must be read out and re-written each time before the data is lost. This refresh time interval is usually 4 to 64 ms. The good thing about a storage cell is that it requires only one capacitor and one transistor, whereas a flip-flop connected in an array requires 6 transistors. In trench capacitor memory technology, which is used in all modem DRAMs, the cell access transistor is constructed above the capacitor so the space on chip is ultimately minimized. For this reason DRAM technology has a lower cost per bit than SRAM technology. The disadvantage of the extra circuitry required for refreshing is easily offset by the lower price per bit when using large memory sizes. Therefore the working memory of almost all computing equipment consists of DRAM memory. DRAM memory is, just like SRAM memory constructed as an array of memory cells. A major difference between SRAM and DRAM, however, lies in the addressing technique. With a SRAM an address needs to be presented and the chip will respond with presenting the data of the memory cell at the output, or accepting the data at the input and write it into the addressed cell. With DRAM technology this simple approach is impossible since addressing a row of data without rewriting it will destruct all data in the row because of the dynamic nature.

SDRAM: SDRAM stands for Synchronous Dynamic RAM. In a normal asynchronous DRAM, the addressing and data read/write is sequenced by external circuitry (the chipset) which needs to wait between each sequence to allow the DRAM to respond to its signals and output/accept the data. With normal DRAM, however, the only way to guarantee reliable operation is to respect the timing specifications and allow sufficient timing margin. It is clear that this is a simple but not a very efficient approach. In a SDRAM, a clock signal is presented to the DRAM by the control circuitry (the chipset). This allows the DRAM to synchronise its operation to that of the control circuits so it knows what signal is coming exactly when and can also respond with a very precise timing. This approach allows operation at much higher speeds.

DDR SDRAM: DDR SDRAM stands for Double Data Rate Synchronous Dynamic RAM. DDR chips are clocked on both the rising and falling clock edge, effectively doubling the transfer rate.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein.

bits A bit (binary digit) refers to a digit in the binary numeral system, which consists of base 2 digits (There are only 2 possible values: 0 or 1). For example, the number 10010111 is 8 bits long. Binary digits are almost always used as the basic unit of information storage and communication in digital computing and digital information theory. A "kilobit" (kb, or kbit) is 1000 bits. A "Megabit" (Mb, or Mbit) is 1,000,000 bits.

Burst error In telecommunication, an error burst is a continuous sequence of symbols, received over a data transmission channel, such that the first and last symbols are in error and there exists no continuous subsequence of m correctly received symbols within the error burst. The integer parameter m is referred to as the guard band of the error burst. The last symbol in a burst and the first symbol in the following burst are accordingly separated by m correct bits or more. The parameter m should be specified when describing an error burst.

bytes A byte is a collection of bits, originally variable in size but now almost always eight bits. (The term octet is widely used as a synonym when greater certainty is desired.) The prefixes used for byte measurements are usually the same as the SI prefixes used for other measurements, but have slightly different values. The former are based on powers of 1,024 ($2^{10}$), a convenient binary number, while the SI prefixes are based on powers of 1,000 ($10^3$), a convenient decimal number. For example, one kilobytes (kB) would have a SI meaning of 1000 bytes, but usually refers to 1024 bytes (1024 is 2 raised to the $10^{th}$ power); one megabyte (MB) would have a SI meaning of 1,000,000 bytes, but usually refers to 1,048,576 bytes (1,048,576 is 2 raised to the $20^{th}$ power).

channel Channel, in communications (sometimes called communications channel), refers to the medium used to convey information from a sender (or transmitter) to a receiver. The channel can be wired, optical, or wireless (including satellite transmissions).

Convolutional Coding

In order to minimize the adverse affects of noise, various forward error correction coding techniques (also known as convolutional coding) have been developed and employed in the past. Typically, in forward error correction coding, at the transmitter, data bits are encoded by adding redundant bits systematically to the data bits so that, normally, only predetermined transitions from one sequential group of bits (corresponding to a symbol, or baud) to another are allowed. There is an inherent correlation between these redundant bits over consecutive bauds. At the receiver, each baud is tentatively decoded and then analyzed based on past history, and the decoded bits are corrected, if necessary.

DDR As SDRAMs have developed, they have been operated at ever increasing clock speeds. The SDRAMs of the second generation were called double data rate (DDR) SDRAMs, and are now often referred to as "DDR-I" SDRAMs. In the second generation of synchronous SDRAMs, clock frequencies of 133 MHz were common. Recently, a third new generation of synchronous SDRAMs are being defined to operate at speeds of two times or greater than DDR-I SDRAMs, and are sometimes referred to as "DDR-II" SDRAMs.

DRAM Short for Dynamic Random Access Memory. DRAM is a type of random access memory that stores each bit of data in a separate capacitor. As real-world capacitors are not ideal and hence leak electrons, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Since DRAM loses its data when the power supply is removed, it is in the class of volatile memory devices.

FIFO FIFO is an acronym for First In, First Out. This expression describes the principle of a queue or first-come, first-served (FCFS) behavior: what comes in first is handled first, what comes in next waits until the first is finished, etc. FIFOs are used commonly in electronic circuits for buffering and flow control. In hardware form a FIFO primarily consists of a set of read and write pointers, storage and control logic. Storage may be SRAM, flip-flops, latches or any other suitable form of storage. For FIFOs of non-trivial size a dual-port SRAM is usually used where one port is used for writing and the other is used for reading.

flip-flop In digital circuits, the flip-flop, latch, or bistable multivibrator is an electronic circuit which has two stable states and thereby is capable of serving as one bit of memory. A flip-flop is controlled by one or two control signals and/or a gate or clock signal. The output often includes the complement as well as the normal output.

FPGA A field programmable gate array (FPGA) is a semiconductor device containing programmable logic components and programmable interconnects. The programmable logic components can be programmed to duplicate the functionality of basic logic gates such as AND, OR, XOR, NOT or more complex combinational functions such as decoders or simple math functions. In most FPGAs, these programmable logic components (or logic blocks, in FPGA parlance) also include memory elements, which may be simple flip-flops or more complete blocks of memories.

interleaver An Interleaver is a functional block (module) that can rearrange the order of data (such as symbols), for example in accordance with an overall forward error correction (FEC) scheme. A de-interleaver restores the original order of the data.

ITU The International Telecommunication Union (ITU; French: Union internationale des telecommunications, Spanish: Unión Internacional de Telecomunicaciones) is an international organization established to standardize and regulate international radio and telecommunications.

M Short for Mega, meaning million. Example: MSym stands for million Symbols.

MPEG Short for Motion Picture Experts Group. MPEG is a working group of ISO/IEC charged with the development of video and audio encoding standards. MPEG's official designation is ISO/IEC JTC1/SC29 WG11. MPEG (pronounced EM-peg) has standardized the following compression formats and ancillary standards:
MPEG-1: Initial video and audio compression standard. Later used as the standard for Video CD, and includes the popular Layer 3 (MP3) audio compression format.
MPEG-2: Transport, video and audio standards for broadcast-quality television. Used for over-the-air digital television ATSC, DVB and ISDB, digital satellite TV services like Dish Network, digital cable television signals, and (with slight modifications) for DVDs.
MPEG-3: Originally designed for HDTV, but abandoned when it was discovered that MPEG-2 (with extensions) was sufficient for HDTV. (Do not confuse with MP3, which is MPEG-1 Layer 3.)
MPEG-4: Expands MPEG-1 to support video/audio "objects", 3D content, low bitrate encoding and support for Digital Rights Management. Several new (newer than MPEG-2 Video) higher efficiency video standards are included (an alternative to MPEG-2 Video), notably:
MPEG-4 Part 2 (or Advanced Simple Profile) and
MPEG-4 Part 10 (or Advanced Video Coding or H.264). MPEG-4 Part 10 may be used on HD-DVD and Blu-Ray discs, along with VC-1 and MPEG-2.
The MPEG standards are incorporated by reference in their entirety, herein.

NVM Short for non-volatile memory. NVM is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of a NVM memory cell is a simple light switch. Indeed, such a switch can be set to one of two (binary) positions, and "memorize" that position.)

packer A packer is a functional block (module) that can accumulate (combine, join) and rearrange data for writing to memory. For example, a packer can accumulate four 8-bit symbols as 32 bits for burst writing to SDRAM. An "unpacker" performs the reverse function, such as taking 32 bits burst read from SDRAM, and un-accumulating (un-combining, splitting) them into four 8-bit symbols—essentially restoring the data to its original, pre-packed form.

RAM Short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

register A register is the name usually given to a small amount of very fast computer memory which can store a small number of bits, for example, an "8-bit register" or a "32-bit register". Registers are now usually implemented as a register file, but they have also been implemented using individual flip-flops, high speed core memory, thin film memory, and other ways in various machines.

RS coding Reed-Solomon (RS) error correction is an error-correcting code that works by oversampling a polynomial constructed from the data. The polynomial is evaluated at several points, and these values are sent or recorded. By sampling the polynomial more often than is necessary, the polynomial is over-determined. As long as "many" of the points are received correctly, the receiver can recover the original polynomial even in the presence of a "few" bad points. Reed-Solomon coding is very widely used in mass storage systems to correct the burst errors associated with media defects./Reed-Solomon coding is a key component of the compact disc (CD). It was the first use of strong error correction coding in a mass-produced consumer product, and DAT and DVD use similar schemes. In the CD, two layers of Reed-Solomon coding separated by a 28-way convolutional interleaver yields a scheme called Cross-Interleaved Reed Solomon Coding (CIRC). The first element of a CIRC decoder is a relatively weak inner (32,28) Reed-Solomon code, shortened from a (255,251) code with 8-bit symbols. This code can correct up to 2 byte errors per 32-byte block.

SDRAM Short for synchronous dynamic random access memory. SDRAM is a type of solid state computer memory. Other dynamic random access memories (DRAM) have an asynchronous interface which means that it reacts as quickly as possible to changes in control inputs. SDRAM has a synchronous interface, meaning that it waits for a clock signal before responding to its control inputs. It is synchronized with the computer's system bus, and thus with the processor. The clock is used to drive an internal finite state machine that pipelines incoming commands. This allows the chip to have a more complex pattern of operation than DRAM which does not have synchronizing control circuits.

shift register In digital circuits a shift register is a group of registers set up in a linear fashion which have their inputs and outputs connected together in such a way that the data is shifted down the line when the circuit is activated. Shift registers can have a combination of serial and parallel inputs and outputs, including serial-in, parallel-out (SIPO) and parallel-in, serial-out (PISO) types. There are also types that have both serial and parallel input and types with serial and parallel output. There are also bi-directional shift registers which allow you to vary the direction of the shift register. The serial input and outputs of a register can also be connected together to create a circular shift register. One could also create multi-dimensional shift registers, which can perform more complex computation sorter A sorter is a functional block (module) that can rearrange the order of data (such as symbols), for example for interleaving. An un-sorter restores the original order of the data.

SRAM Static random access memory (SRAM) is a type of semiconductor memory. The word "static" indicates that the memory retains its contents as long as power remains applied, unlike dynamic RAM (DRAM) that needs to be periodically refreshed. (Nevertheless, SRAM should not be confused with read-only memory and flash memory, since it is volatile memory and preserves data only while power is continuously applied.)

State Machine
A finite state machine (FSM) or finite state automaton (plural: automata) is a model of behavior composed of a finite number of states, transitions between those states, and actions. A state stores information about the past, i.e. it reflects the input changes from the system start to the present moment. A transition indicates a state change and is described by a condition that would need to be fulfilled to enable the transition. An action is a description of an activity that is to be performed at a given moment. The concept of the FSM is at the center of theory of computing, as it begins with the basic processes by which finite bits of properly encoded information could theoretically be handled intelligently by a machine.

symbols A symbol may comprise a number (n) of bits. A "word" may also comprise a number of bits. A word may comprise a number of symbols.

SUMMARY OF THE INVENTION

It is a general object of the invention to provide an improved technique for performing convolutional interleaving.

According to the invention, generally, an Interleaver is implemented using a SRAM to buffer and sort data (symbols) from two paths before burst writing the data to a SDRAM. The symbols from the two paths are pre-sorted so that symbols from each path are grouped together, enabling large sequential burst writes from the SRAM to the SDRAM where only one break in the sequential interleaver write address occurs. Also, SDRAM may be written to, 4 symbols wide, by accumulating four full interleaver commutator loops before writing. This may, for example, enable an increase of throughput from a previous level of 96/16 M symbols/second to approximately 110 M symbols/second.

According to a feature of the invention, a small SRAM is used to reorder and store SDRAM data such that the SDRAM access can be optimized so that a dual path Convolutional Interleaver can be implemented efficiently.

According to a feature of the invention, data is sorted and collected in SRAM such that large sequential Burst writes can be done to the SDRAM.

According to a feature of the invention, a group of sixteen channel symbols may be sorted such that only one break in sequential Interleaver write address occurs.

According to a feature of the invention, data for four full Interleaver commutator loops is accumulated, to be able to write four symbols wide to the SDRAM which will optimize the access time.

According to a feature of the invention, dual path Interleaver data is stored by writing the data in a staggered pattern such that a linear read can be done. Further this provides an advantage that write address changes are faster than read address changes during a Burst sequence.

According to a feature of the invention, dual path Interleaver data is stored in a SDRAM such that a linear 32 bit read will provide the data stream that represents the stream from a dual path Interleaver.

According to the invention, a method of interleaving data comprises: providing two interleaver paths; receiving a plurality of symbols; assigning each of the symbols to a given one of the two paths; and sorting the symbols to minimize a number of breaks in a sequential Interleaver write address.

After sorting, the symbols are burst written to SDRAM. After sorting, there is only one break in the sequential Interleaver write address. Before writing to SDRAM, data is accumulated for four commutator loops at a time; and the data is written four symbols wide to optimize SDRAM access time. Thus, 8 bit symbols are written 32 bits at a time to SDRAM.

According to an embodiment of the invention, a method of interleaving data comprises: providing two interleaver paths; receiving a plurality of symbols; assigning each of the symbols to a given one of the two paths; and sorting the symbols to minimize a number of breaks in a sequential Interleaver write address. After sequentially sorting, the symbols may be burst written to SDRAM, and there may be only one break in the sequential Interleaver write address. A plurality of symbol channels may be provided.

According to another embodiment of the invention, before writing to SDRAM, data for four FEC symbols at a time may be accumulated; and then writing four symbols wide to optimize SDRAM access time. The FEC symbols may be 8 bits; and data may be written 32 bits at a time to SDRAM to fit the SDRAM interface. Two interleaver paths may be provided. Prior to packing, the symbols may be sorted to minimize a number of breaks in a sequential interleaver write address, thereby enhancing performance.

According to another embodiment of of the invention, dual path Interleaver data may be stored in SDRAM by writing the data in a staggered pattern such that a linear read can be done to gain speed. Staggering may be restarted within a commutator loop to keep SRAM small while maintaining the interleaver structure and the burst write feature to the SDRAM. Data may be stored in the SDRAM such that a linear 32 bit read will provide the data stream that represents the stream from the dual path Interleaver.

According to another embodiment of the invention, a method of interleaving data which is a sequence of symbols is disclosed, wherein "I" represents an interleaving depth and "J" represents an interleaving increment. This embodiment comprises writing the sequence of symbols to SRAM, the SRAM having a number "r" of rows and a number "c" columns. In particular, the symbols are written by (a) writing a first symbol to address located at a first column and a first row of the SRAM; (b) writing a next-in-the-sequence symbol in a new column which is J columns removed from the previous column, and in a new row of the SRAM which is one row removed from the previous row; and (c) repeating the step (b) until all the symbols are written to SRAM. According to a further feature of the invention, (d) after writing all of the symbols to SRAM, the data is burst written to SDRAM.

According to yet another feature of the invention, the data may be written in a staggered pattern defined by the relationships: c_new=(c_previous+J) modulo 4, where "c" is the column number; and r_new=(r_previous+1) modulo I, where "r" is the row number.

Using a combination of these features can produce a gain of up to a factor of 10 in performance. For example, according to an embodiment of the invention, a method of interleaving data comprises providing two interleaver paths and a plurality of symbol channels; receiving a plurality of symbols; assigning each of the symbols to a given one of the two paths; sorting the symbols to minimize a number of breaks in a sequential interleaver write address; and after sequentially sorting, burst writing the symbols to SDRAM. After sequentially sorting, there is only one break in the sequential interleaver write address. Before writing to SDRAM, data is accumulated for four FEC symbols at a time, and written four symbols wide to optimize SDRAM access time. The FEC symbols are 8 bits, data is written 32 bits at a time to SDRAM to fit the SDRAM interface, and data is written to SDRAM in a staggered pattern such that a linear read can be done to gain speed. Staggering may be restarted within a commutator loop to keep SRAM small while maintaining the interleaver structure and the burst write feature to the SDRAM.

A further method of interleaving data in accordance with the invention comprises receiving a plurality of symbols, wherein each of the symbols is assigned to one of two paths. The symbols are sorted so that all of the symbols assigned to one of the two paths are grouped together, and all of the symbols assigned to another of the two paths are grouped together. Using SRAM, the sorted symbols are packed in a staggered pattern so that data can be burst written to SDRAM. When the SRAM has a full block corresponding to a SDRAM Burst block, a full length burst write from SRAM to SDRAM may be performed.

Apparatus for interleaving data in accordance with the invention comprises means for sorting symbols which are assigned to one of two paths, and grouping the symbols so that a first portion of symbols which are assigned to a given one of the two paths are grouped together and a remaining portion of symbols which are assigned to another given one of the two paths are grouped together. Means are provided for storing the sorted symbols in a staggered pattern so that data can be burst written to SDRAM. Means are also provided for burst writing the symbols to SDRAM. The means for storing the sorted symbols in a staggered pattern may comprise SRAM.

BRIEF DESCRIPTION OF THE DRAWINGS

The invention may be more fully appreciated in connection with the following detailed description taken in conjunction with the accompanying drawings.

DETAILED DESCRIPTION OF THE INVENTION

Figure 1:
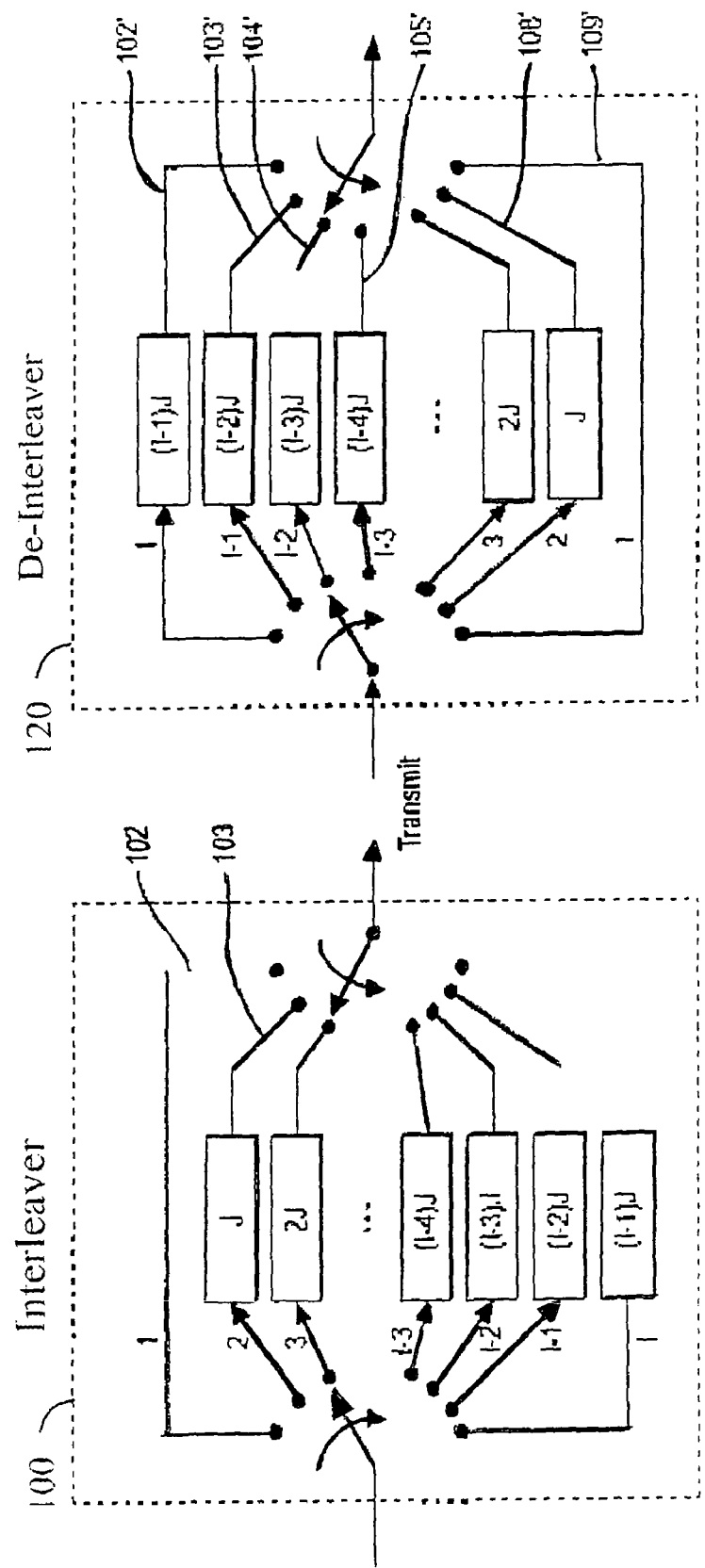
FIG. 1 is a simplified schematic block diagram illustrating a typical convolutional interleaver and deinterleaver, according to the prior art.
Figure 2:
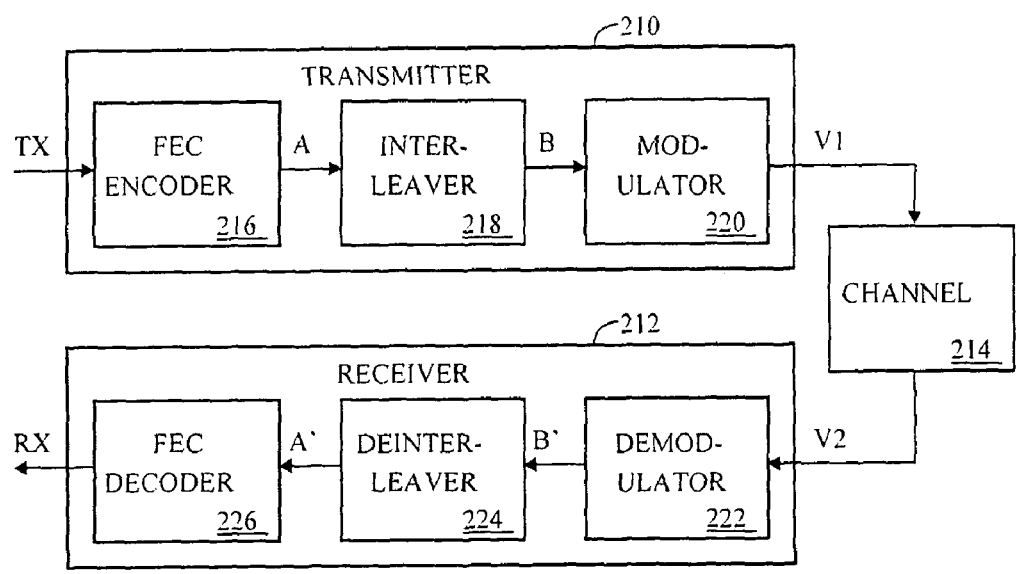
FIG. 2 is a diagram of a data communications system, according to the prior art.
Figure 3:
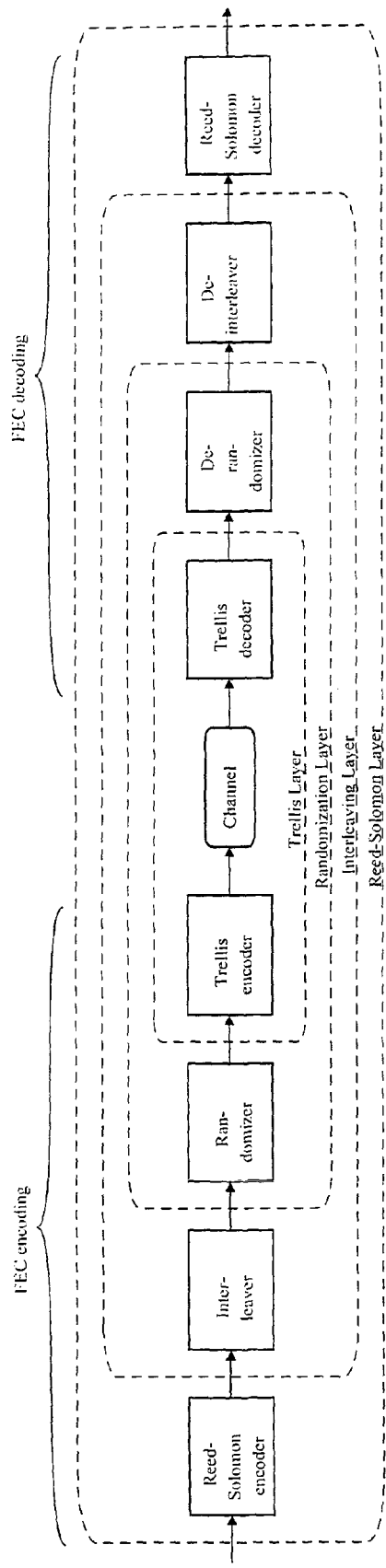
FIG. 3 is a diagram of a communications system comprising a convolutional interleaver, according to the prior art.

According to the invention, generally, a two (2) path interleaver is set up with multiple channels, and each channel can go through a short path or a long path and perform at high speed due to the channel sorting in SRAM. Further, staggered writes to the SRAM allows the SRAM to be small, which is beneficial when implemented in FPGA. Additionally, the writes are packed to support many interleaver modes with the small SRAM. The techniques disclosed herein support having two interleaver lengths without resulting in a tremendous slowdown and dual SDRAM.

The present invention makes it possible to implement a SDRAM Convolutional Interleaver with two paths (A and B) by using SDRAM, FPGA logic and FPGA SRAM.

A problem being addressed by the present invention is that Burst writes to a SDRAM two path interleaver would max out at (be limited to) a throughput of 10 M Symbols/sec, and a higher symbol rate (such as 110 M Symbols/sec) is desired.

According to the invention, the symbol contents are written to a small SRAM, and later are Burst written to the SDRAM so that the higher symbol rate (110 MSym/sec) can be achieved.

Technical Setting for an Exemplary Embodiment of the Invention

An Interleaver may typically receive a data stream of 144 megasymbols per second. Each symbol is 7 bits wide. The symbol stream is built up by block entities of 128 symbols. Each such 128 symbol blocks are built up by groups of 16 symbols. In this group of 16 symbols, one of the 16 symbols belongs to a "Channel".

SDRAM is generally the memory of choice for an interleaver, such as described herein. See, for example, FIG. 5 of the Wan reference discussed above (main memory 46, suitably an SDRAM external to the IC chip 53).

However, having two interleaver paths can make memory access extremely inefficient in SDRAM, due to the architecture of the SDRAM. While SRAMs do not suffer from this limitation, as a general proposition SRAM is much more expensive than SDRAM. SRAM is also limited in FPGA implementations.

Generally, when using SDRAM, you want to write a row at a time. Speeds are best when staying in a given row. Also, SDRAM works most efficiently when writing and reading 32 bits per cycle. This can present a challenge if the data being stored is 8 bits wide stream.

In the past, interleaving the data stream has been implemented by writing and reading to/from a SDRAM. The writing is sequential with an incrementing address. The reading takes place from locations as specified by the interleaving algorithm.

One of the concerns of accessing the SDRAM is that you pay a penalty of clock cycles every time you change from read to write and every time you change the flow of data to be from a non-subsequent address. An even higher penalty is paid for a row change.

The SDRAM access problem is exacerbated when the interleaver must support two data paths. This means that two different address sequences must be switched and supported by SDRAM while maintaining the data flow. The most efficient way to utilize SDRAM is thus to read and write row-by-row, in "bursts" of data which is 32 bits wide.

According to the invention, generally, a method of burst writing a non-linear address sequence cyclic packed interleaver pattern to an SDRAM by use of an additional SRAM is disclosed. (As used herein, "burst" writing refers to a mode of writing or reading to a plurality of sequential memory addresses, such as in SDRAM.)

As set forth in Section B.5.2 (Interleaving) of the ITU Specification, "Interleaving is included in the modem between the RS block coding and the randomizer to enable the correction of Burst noise induced errors. In both 64-QAM and 256-QAM a convolutional interleaver is employed. Convolutional interleaving is illustrated in FIG. B.8. At the start of an FEC frame defined in a subsequent subclause, the interleaving commutator position is initialized to the top-most branch and increments at the RS symbol frequency, with a single symbol output from each position. With a convolutional interleaver, the RS code symbols are sequentially shifted into the bank of I registers (the width of each register is 7 bits which matches the RS symbol size). Each successive register has J symbols more storage than the preceeding register. The first interleaver path has zero delay, the second has a J symbol period of delay, the third 2*J symbol periods of delay, and so on, up to the Ith path which has (I−1)*J symbol periods of delay. This is reversed for the de-interleaver in the Cable Decoder such that the net delay of each RS symbol is the same through the interleaver and de-interleaver. Burst noise in the channel causes a series of bad symbols. These are spread over many RS blocks by the de-interleaver such that the resultant symbol errors per block are within the range of the RS decoder correction capability." In addition, two delay lengths and therefore two paths "A" and "B" have to be supported.

Input Data

Figure 4:
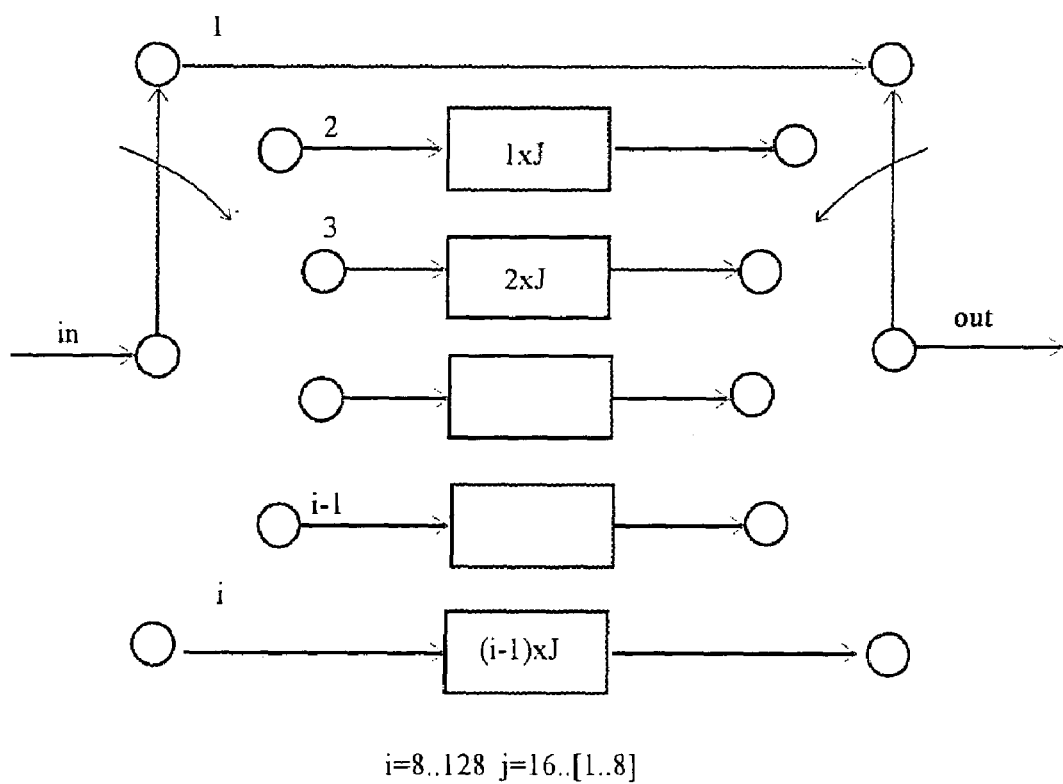
FIG. 4 is a diagram illustrating a convolutional interleaver, such as may be used with the present invention.

FIG. 4 illustrates an architecture for a convolutional Interleaver, according to an exemplary embodiment of the invention. (The interleaver is essentially the same as the interleaver shown in FIG. 1.)

Input data (in) to the Interleaver is structured to have i=128 groups of j=16 symbols. The first 16 symbols are all the first symbols of 16 Reed-Solomon packages of 128 symbols. The conversion from 128×16 to 16×128 is done before the Interleaver.

"AB Path" Convolutional Interleaver

A convolutional interleaver serves the purpose of distributing a possible transmission error over a longer sequence of symbols. The interleaver enables for better error correction of burst noise. The interleaver delays symbols in a predefined way. The first symbol of a packet is not delayed, subsequent symbols are delayed more and more. The interleaver delay is defined by I and J. I represents the number of taps, and J represents the delay for tap 1.

The Interleaver of the present invention addresses a change in the ITU Interleaving specification (ITU-T Recommendation J.83), and works much like previous interleavers, but supports two data paths ("A" and "B") within the Interleaver itself. Any of 16 symbols should be able to go through path A or path B. The different paths implement a unique interleaving algorithm (1 out of 13).

The Interleaver of the present invention supports 2 paths, designated "A" and "B", and each path should have a configurable delay mode. A given path could be used for Video or Data.

The Interleaver must support 13 modes. The [I, J] modes defines the structure of the interleaver and its delay.

I can have values [1, 16, 32, 64, 128].
J can have values [1, 2, 3, 4, 5, 6, 7, 8].
16 Channels can (worst case) result in 15 mode changes from path to path.

Data Flow

Figure 5:
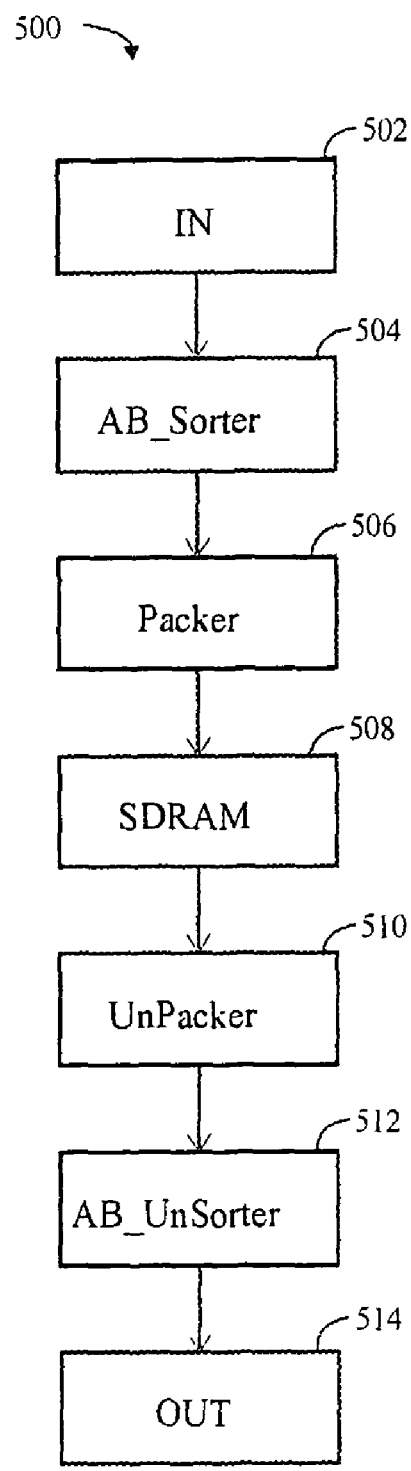
FIG. 5 is a diagram showing major components of the present invention, and how they related to one another.

FIG. 5 illustrates an exemplary overall data flow, according to the invention. An exemplary embodiment of the Interleaver 500 generally comprises 5 functional blocks (modules).

a Sorter (such as 504, described hereinbelow),
a Packer (such as 506, described hereinbelow),
an SDRAM State Machine (such as 508, described hereinbelow),
an UnPacker (such as 510, described hereinbelow), and
an UnSorter (such as 512, described hereinbelow).

In this example, input data 502 (IN) to the Interleaver is organized as 16+16+16 . . . . Symbols, which helps to provide a desirable sequence that only has 1 change of destination address after AB_Sorting (described below). The address change relates to the change from "A" data to "B" data within the 16 Symbols, which could worst case result in 15 changes if not addressed.

In the AB_Sorter 504, the Symbols for the A and B path are sorted in groups so that the switch of SDRAM address for the A and B path will not break the SDRAM Burst sequence. This is described in greater detail hereinbelow, with reference to FIG. 6 (Sorter).

The 16 symbols are originally in a conventional order, such as 1, 2, 3, 4, 5, 6, 7, 8, 9, 10, 11, 12, 13, 14, 15, 16. Selected ones of the symbols are assigned to the "A" symbol path, the remaining symbols are assigned to the "B" data path. Generally, "N" symbols are assigned to the "A" path, and 16-N (sixteen minus "N") symbols are assigned to the "B" path. For example, N=10 symbols are assigned to the "A" path, and 16−10=6 symbols are assigned to the "B" path.

The Sorter serves the purpose of altering the order of the 16 symbols such that all of the symbols that are going to the "A" symbol path get grouped together and all of the symbols that are going to the "B" symbol path get grouped together. The Sorter knows which symbol should go in the A or B direction by observing a 16 bit vector that is an input to the Interleaver.

After sorting the input data, a Packer 506 performs four column packing, so that four Symbols (or 32 bits) can later be written to the SDRAM. This is done using SRAM. The writes to the SRAM are performed such that a staggered pattern (e.g., a defined staggered pattern) will be placed in the SRAM. As time advances, the staggered pattern will fill up the SRAM. At the point that the SRAM has a full block corresponding to a SDRAM Burst block, a full length Burst write can be performed to SDRAM.

In addition to a staggered pattern, the writes to the SRAM are "moved back" in address as often as possible. As used herein, "moved back" refers to subtracting a number from the SRAM address. The subtraction is compensated for at the start of each Burst write to the SDRAM. As "often as possible" refers to that avoiding breaking a Burst sequence to SDRAM while keeping the SRAM small, and therefore subtract as soon as permitted. This is described in greater detail hereinbelow, with reference to FIGS. 7 and 8 (Packer).

The Packer 506 comprises a FIFO with an 8(7) bit input path and a 32(28) bit wide output path. Both the sorting and the 32 bit organization (packing) of the data serves the purpose of optimizing the timing for subsequent accesses to the SDRAM 508.

The SDRAM 508 receives data as 32 bits and the sorting (504) helps out by making sure that the later Reads from the SDRAM can take place in a subsequent order with only one change from the A address to the B address. In addition 4× of the 16 groups will be used for the SDRAM access. This will further help to optimize the SDRAM timing.

64 Symbols should pass in 64 clocks to sustain a 144M symbol rate. The SDRAM should need 2×(64/4)=32 clocks for reading and writing 64 symbols. The divide by 4 (64/4) is from the use of DDR (×½) and from the 16 bit wide data path (×½). The 2× is from the fact that a read and write access is needed for each symbol. This will result in 32 clocks to "spare". These clocks are needed for switching between "read to write" (10 clks), read address change (10 clks) and other SDRAM overhead (12 clocks).

The SDRAM 508 harbors (temporarily stores) the data written (burst written) from the Packer 506. This is described in greater detail hereinbelow, with reference to FIGS. 9 and 10 (SDRAM), where a diagonal from the written data can be seen.

A State Machine controls operation of the SDRAM. Generally, the SDRAM State Machine works like State Machines implemented in existing Interleavers. However, a difference is that rather than writing and reading 16 symbols, the State Machine writes 16 symbols (which were sorted and packed), then reads N symbols, and then read (16-N) symbols. The N symbols are coming through the A path and the (16-N) symbols are from the B path. N is selected by a 16 bit vector.

For SDRAM using a 32 bit path, it is possible at times to do 5 reads (20 symbols) rather than 16.

In the example mentioned above, the A path has 11 symbols and the B path has 5 symbols. Some alternatives are:
  If the A and B path have 8 symbols each, 4 reads will be performed.
  If the A path has 3 symbols and the B path has 13 symbols, 5 reads will be performed. 1 read from the A path to get 3 symbols and 4 reads from the B path to get 13 symbols.
  Writes combine 4×16 symbols.
  Reads combine 4×N/16 symbols for the A path.
  Reads combine 4×(16-N)*16 symbols for the B path.

An UnPacker 510 will read 4 Symbol wide data from the SDRAM, row-by-row. After a full column write is complete the read of a single column starts. The UnPacker read stream provides data to an UnSorter 512. This module will read 32 bits to its FIFO and the output will be 16 bits. This is described in greater detail hereinbelow, with reference to FIG. 11 (UnPacker).

The AB_UnSorter 512 reverts the AB_Sorter 504 process. This is described in greater detail hereinbelow, with reference to FIG. 12 (AB_UnSorter).

The Unsorter 512 will receive the A and B path symbol stream from the SDRAM and then take a block of 16 symbols and put them back in the 16 positions available for that block in such a way that the channel order is maintained the way it was before it was sorted. This logic block 512 also contains a FIFO to convert the 32 bit symbol stream to a 7 bit wide output data path. It is important to note that that the A and B path will NOT have the same "delay" through the Interleaver. One path could have a 0.15 ms latency and the other path could have a 22 ms latency. The A and B channels will therefore NOT have the "same" delay after the Interleaver.

FIGS. 6-12 provide further details and an example of operation of the 5 modules (sorter, packer, SDRAM, unpacker, unsorter) set forth hereinabove.

Figure 6:
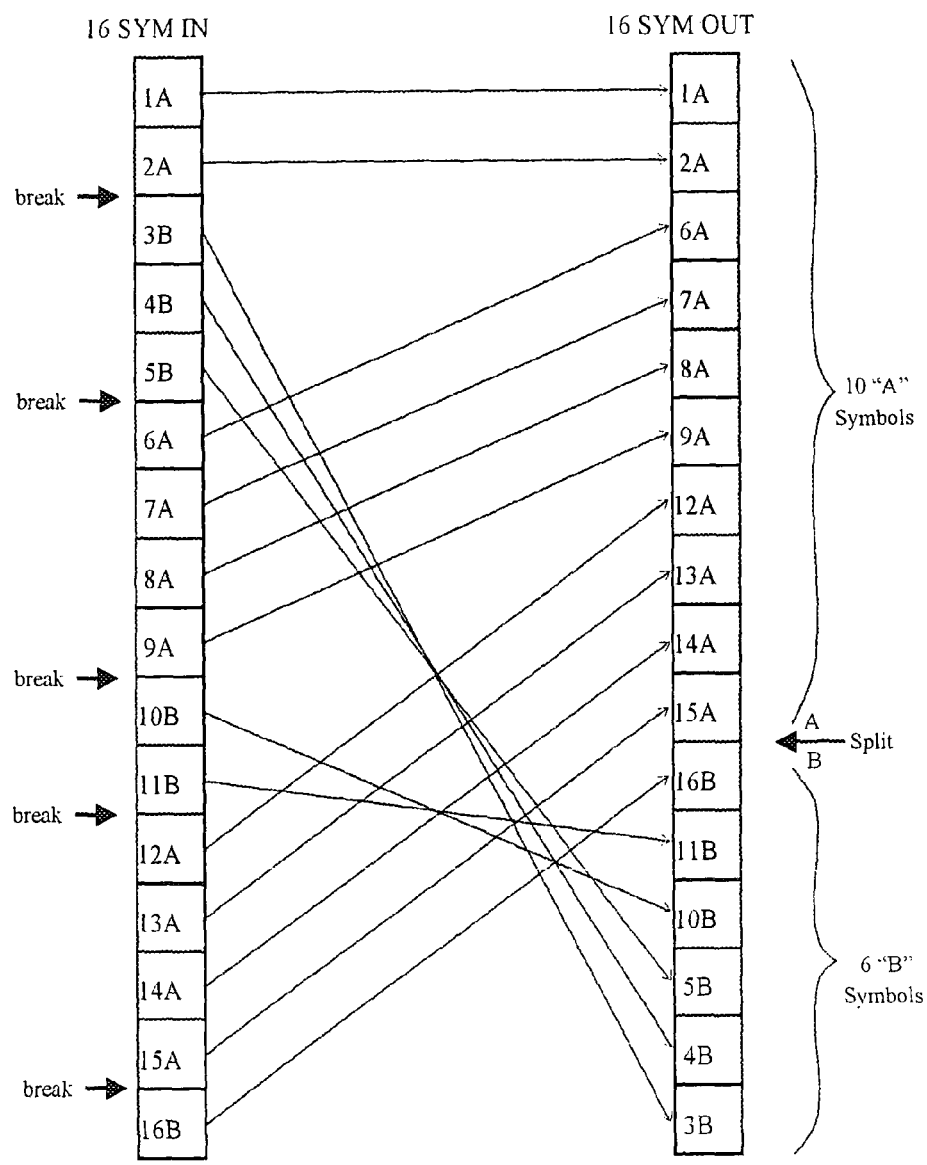
FIG. 6 is a diagram illustrating operation of a Sorter, according to the invention.

AB_Sorter (FIG. 6)

The sorter (504) serves the purpose of altering the order of the 16 input symbols such that all of the symbols that are going to the "A" symbol path gets grouped together and all of the symbols that are going to the "B" symbol path gets grouped together. The sorter (504) knows which symbol should go in the A or B direction by observing a 16 bit vector that is an input to the Interleaver.

FIG. 6 illustrates the operation of a sorter (AB_Sorter) for sorting the input data to an output stream, according to an exemplary embodiment of the invention.

The column on the left side of the figure shows a total of 16 total input symbols 1-16. Ten (N=10) symbols 1, 2, 6, 7, 8, 9, 12, 13, 14, 15 are assigned to the "A" path. Six (16-N) symbols 3, 4, 5, 10, 11, 16 are assigned to the "B" path.

The column on the right side of the figure shows the sixteen input symbols, rearranged, so that all of the A-path symbols (1, 2, 6, 7, 8, 9, 12, 13, 14, 15) are grouped together, followed by the remaining B-path symbols (16, 11, 10, 5, 4, 3)

Before sorting (16 SYM IN), it can be observed that there are 5 "breaks". (A break is defined as a transition from A to B, or from B to A). In a "worst case" scenario, there could be fifteen breaks, if every second symbol alters from A to B. For example, all of the odd-numbered symbols (1, 3, 5, 7, 9, 11, 13, 15) assigned to the A-path, and all of the even numbered symbols (2, 4, 6, 8, 10, 12, 14, 16) assigned to the B-path.

After sorting (16 SYM OUT), there is only one break ("split") in the burst address. Having only one break in the burst address is desirable, to maximize performance of burst writing to SDRAM, since only one break in the sequential Interleaver write address occurs.

Figure 7:
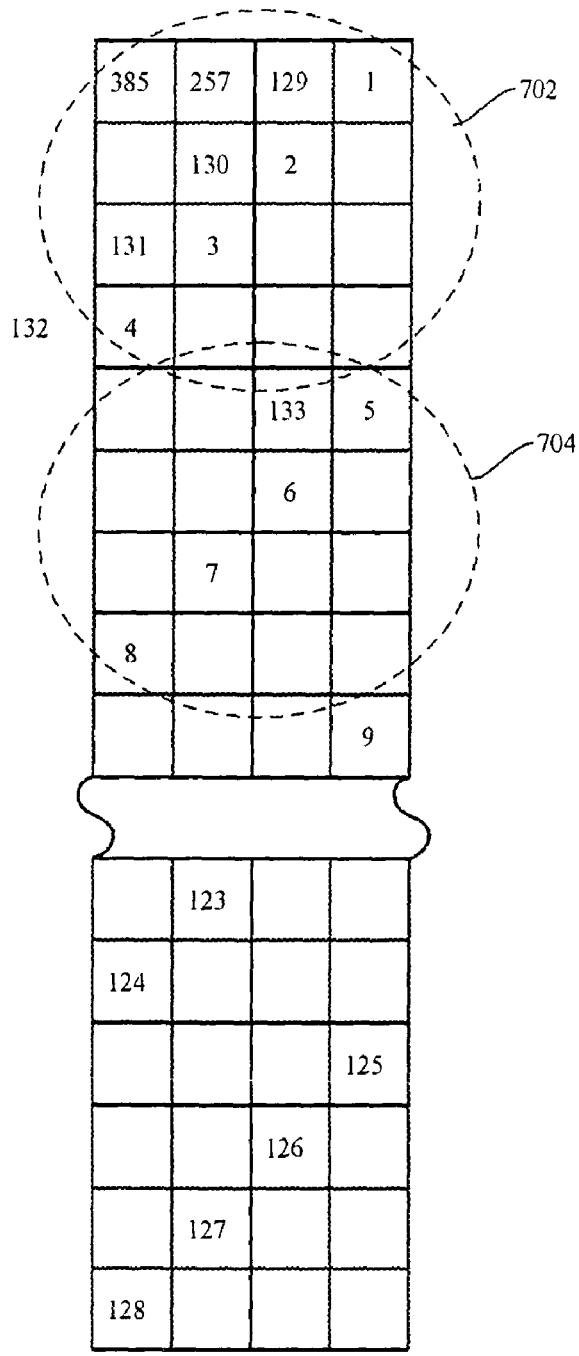
FIGS. 7 and 8 are diagrams illustrating operation of a Packer, according to the invention.
Figure 8:
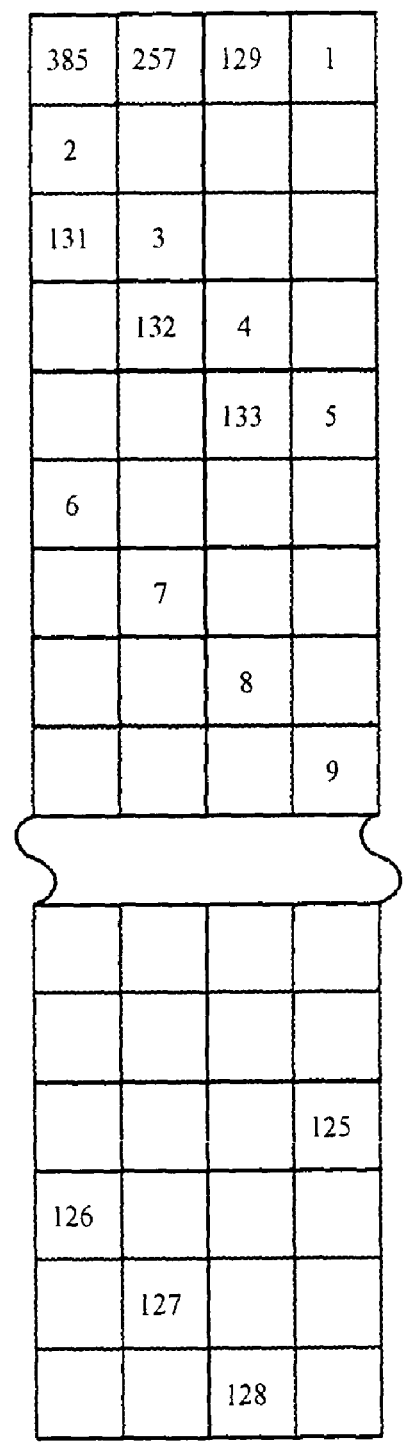

Packer (FIGS. 7 and 8)

Before writing to SDRAM, the sorted symbols need to be packed. Recall, from above, that in this example the symbols are 8 bits, and SDRAM is most efficient when writing 32 bits at a time.

The Packer (506) further places the sorted symbols into a FIFO with an 8 (7) bit input path and a 32 (28) bit wide output path. Both the sorting and the 32 bit organization of the data serve the purpose of optimizing the timing for the accesses to the SDRAM. The SDRAM receives data as 32 bits making sure that the later reads from the SDRAM can take place in a subsequent order.

Four at a time, of the 16 8-bit symbols are packed to be written as 32 bits to SDRAM, to optimize SDRAM access time. In other words, data from 4 full interleaver commutator loops are accumulated for writing 4 symbols wide to SDRAM.

FIG. 7 is a diagram illustrating a packer for I, J=128,1, and FIG. 8 is a diagram illustrating the packer for I,J=128,3. In these two figures, there are four columns (vertical) and a plurality of rows (horizontal). Only 15 rows are shown, for illustrative clarity.

A plurality of "boxes" are shown. Each box refers to 16 symbols. For example, the box marked "1" refers to symbol 1 . . . 16, each symbol being the first symbol in 16 MPEG blocks. All 16 symbols should be treated the same, so they are shown as a single box. The box marked "2" refers top each of the second symbols in the 16 MPEG blocks, and so forth.

The Packer is read out, one row at a time. For example, Sym 1 of Sym block [385,257,129,1] will be read out of the Packer and be written to SDRAM as 32 bits.

Sixteen of such rows will be burst-written to the SDRAM before a SDRAM row address change. Therefore, a minimum of 64 bytes can be written without a SDRAM address change.

In FIGS. 7 and 8, it can be observed that the "5" (representing the fifth symbol of 16 MPEG blocks) is "pulled back" to the right-hand column. However, it should be understood that when written to the SDRAM, the 5 will be written below and to the left of the 4. This staggering ensures that a linear read can be done when the SDRAM is read, maintaining the interleaver.

Staggering Patterns for Supporting all 13 Interleaver Modes

The Interleaver supports 13 [I,J] modes, wherein "I" can have five values [1, 16, 32, 64, 128] and "J" can have eight values [1, 2, 3, 4, 5, 6, 7, 8].

After sorting (504), the data (symbols) are staggered as they are packed (506) into SRAM, prior to burst writing (507) to SDRAM, while maintaining the burst writing capability to the SDRAM. The staggering pattern (algorithm) is slightly different for each of the modes, and depends on I and J for each mode.

Two examples of staggering (or pre-staggering, or pre-processing) data and temporarily storing (writing) the data in SRAM, prior to and in prepation for burst-writing to SDRAM are set forth hereinabove, in FIGS. 7 and 8.

With reference to FIG. 7, for I=128 and J=1, it can be observed that in a SRAM have a 4-column wide (and "n" rows) architecture, the first symbol "1" is written in column 1 (right hand column), row 1 (top row). (Writing the first symbol in the first column, first row is assumed to be true for all cases.) The second symbol "2" is written in column 2 (the "Jth" column to the left of the previous column, in this case the next column since J=1), row 2 (the next row down, n=n+1). Note that, for each subsequent symbol, in all cases, the next symbol is written in the next row down. The third symbol "3" is written in column 3 (J columns to the left of the column where the previous, second symbol was stored), row 3 (the next row down). The fourth symbol "4" is written in column 4 (again, J=1 columns to the left of where the previous, third symbol was stored), row 4 (the next row down).

This being a four-column wide architecture, the next symbol "5" is written in column 1 (the column sequence is 1,2,3,4,1,2,3,4,1,2,3,4 . . . ), which is one (J=1) column to the left of column 4, wrapping around back to column 1, and in the next row down (n=n+1). Always, the next symbol is written in the next row down, according to the staggering pattern defined herein.

Figure 9:
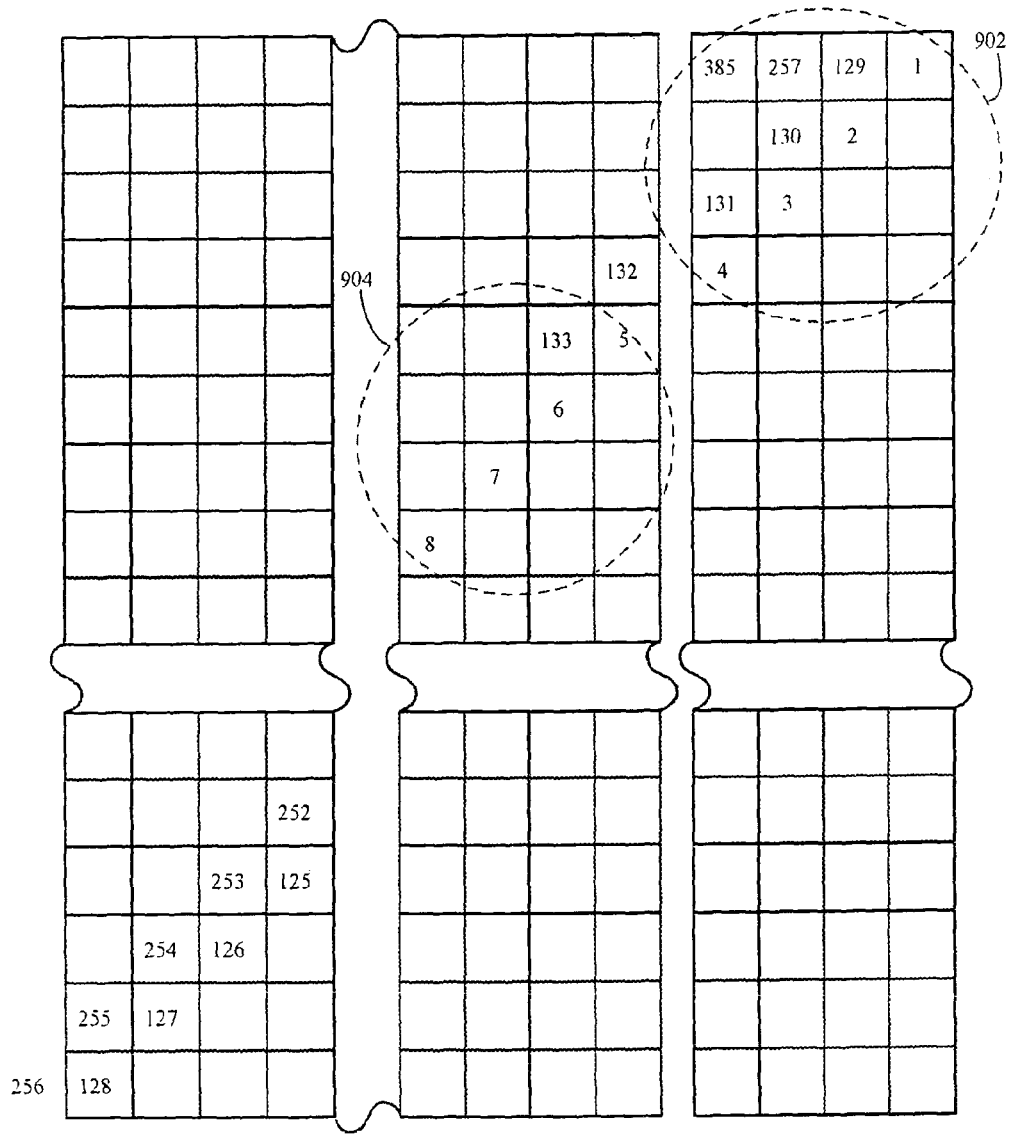
FIGS. 9 and 10 are diagrams illustrating operation of a SDRAM, according to the invention.

FIG. 9 shows how the data from FIG. 7 is arranged in the wider (32 columns) SDRAM after burst writing.

In the FIG. 8 example of staggering according to a defined pattern, J=3, it can be observed that each subsequent symbol is written J=3 columns to the left of the previous symbol. Again, with the four column wide architecture, the sequence with J=3 thus becomes 1,4,3,2,1,4,3,2,1,4,3,2 . . . . A simple formula for this is c_new=(c_last+J) modulo 4, where "c" is the column number ("last"=previous). Each subsequent symbol is written to the next row down, as in the previous example (for I,J=128,1).

As is evident from these examples, the columns are written "J" columns to the left for each subsequent symbol, wrapping around (back to column 1) when the last column (in this example, column 4) is reached. It will be understood that the direction "left" is simply a nomenclature for a direction in a sequence of columns, in this example the SRAM is arranged to have four columns. In modular arithmetic, sometimes called modulo arithmetic, or clock arithmetic, numbers which are incrementing (1, 2, 3, 4, . . . ) wrap around after they reach a certain number, i.e., the highest permitted number. For example, in a clock the numbers "wrap" back to 1 after passing 12. In the present example of SRAM, the columns wrap back to 1 after passing 4. For J=1, each subsequent symbol is written to the $1^{st}$ next column in the sequence, for J=2, each subsequent symbol is written to the $2^{nd}$ next column in the sequence, for J=3 the next symbol is written to the $3^{rd}$ next column in the sequence, and so forth, for each possible value for J.

Note that other arrangements of the memory can easily be accommodated. For example, eight groups of four columns may be arranged side by side for practical reasons. Using the 8×4 column block arrangement side by side in the SRAM, the address will have to be changed less often while writing to the SDRAM. This represents a compromise between the SRAM size and the simplicity/performance of the associated logic. In cases of an SRAM with more than four columns, as in the example of an 8×4 column block arrangement, the embodiment illustrated in FIGS. 7 and 8 would double their width for eight columns and triple their width for twelve columns. Other width configurations will be apparent to those skilled in the art.

In the examples given above, each next symbol is written to the next row down in the SRAM. This continues until "I" is reached. The number of rows which are written depends on "I." In a manner similar to how the columns are counted modularly (1, 2, 3, 4, 1, 2, 3, 4, . . . ), when the $I^{th}$ row is reached (in the examples given above, I=128), the next write will be to row 1. This is the concept of forcing a restart of staggering. Expressed as a formula, this is r_new=(r_last+1) modulo I, where "r" is the row number ("last"=previous).

Memory addresses are typically designated by row and column, generally, where the specified column intersects (crosses) the specified row. This nomenclature may refer to individual memory cells, which can only store one or a few bits of data, as well as to blocks of contiguous memory cells which can hold many bits of data. It will be understood that "column 1" or "first column" refers to an initial column of the SRAM (or SDRAM, described hereinbelow), and that "row 1" or "first row" refers to an initial row of the SRAM (or SDRAM, described hereinbelow).

It should be understood that the SRAM may have more than "I" rows, but the staggering pattern is defined to restart at row 1 after row "I" is reached. And, the SRAM may have more than four columns, but the staggering pattern restarts at column 1 after column 4 is reached. All this prepares the data for efficient burst writing to SDRAM. In the case of I=128, we can see the SRAM as a 128 row array. If I=8, we can keep the 128 rows but see them as sixteen blocks of eight rows below each other. This way, we can conceptually hold on to the thought of 128 rows, but let the staggering restart sixteen times within the 128. Each and every $8^{th}$ row of the 128 will be seen as row 1 within the block.

If "I" is 128 writing is staggered to the SDRAM from row 1 to 128. If "I" is 8, 16=128/8 restarts of staggering to the SDRAM will be forced. Restarting is forced at the end of "I" write cycles. At the end of "I" write cycles, the next write moves back to the start column after row I. There are two kinds of column restart. When row "I" is reached, staggering is restarted in both SRAM and SDRAM. When restarting in SRAM only, to keep the SRAM small (note the four column example above), the SDRAM address is incremented to compensate for this kind of restart.

Figure 10:
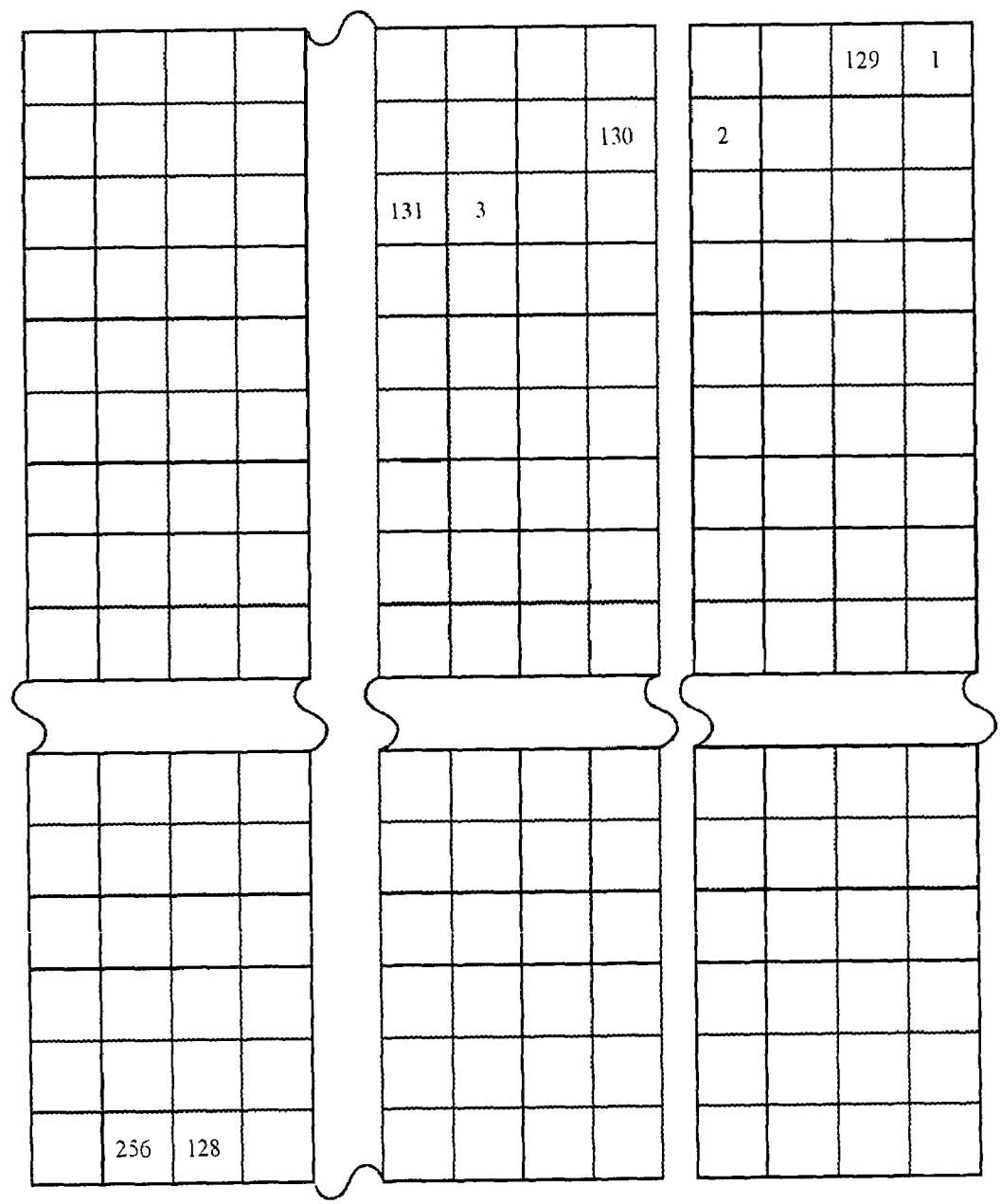

SDRAM (FIGS. 9 and 10)

In this embodiment the SDRAM and its State Machine works much like the one implemented in past interleavers. A difference is that rather than writing/reading 16 symbols, the state machine will now write/read N symbols and then write/read (16-N) symbols. The N symbols are for the A path and the (16-N) symbols are for the B path. N is selected by a 16 bit vector.

Since the SDRAM uses a 32 bit path, 5 reads (5×4=20 symbols) may be done, rather than 16. If the A and B path has 8 symbols each, 4 reads can be done. If there are 3 A symbols and 13 B symbols, 5 reads can be done—1 read from the A path to get the 3 symbols and 4 reads from the B path to get the 13 symbols.

Writes will combine 4×N symbols*16.

Writes will combine 4×(16-N)*16 symbols for the B path.

FIG. 9 illustrates the SDRAM for I, J=128,1, and FIG. 10 illustrates the SDRAM for I,J=128,3. As was the case in FIGS. 7 and 8, each box refers to 16 symbols. Only three out of a total of eight columns are shown. Writes are done in a staggered way, from top right to bottom left, four columns at a time to maintain the interleaver delays. Reads are done four columns at a time from top down, then the next four columns.

For example, in FIG. 9, the symbols 1,2,3 and 4 follow a "45-degree" diagonal, each being located one row down and one column to the left of the previous symbol. The same diagonal pattern can be observed in FIG. 9 for the symbols 5,6,7 and 8.

Notice, for example, that the group (labeled 902) of 16 (4×4) boxes at the top right of FIG. 9 replicates the group (labeled 702) of 16 boxes at the top of FIG. 7. (And, as will be seen, is the same as the group (labeled 1102) of 16 boxes at the top right of FIG. 11).

Figure 11:
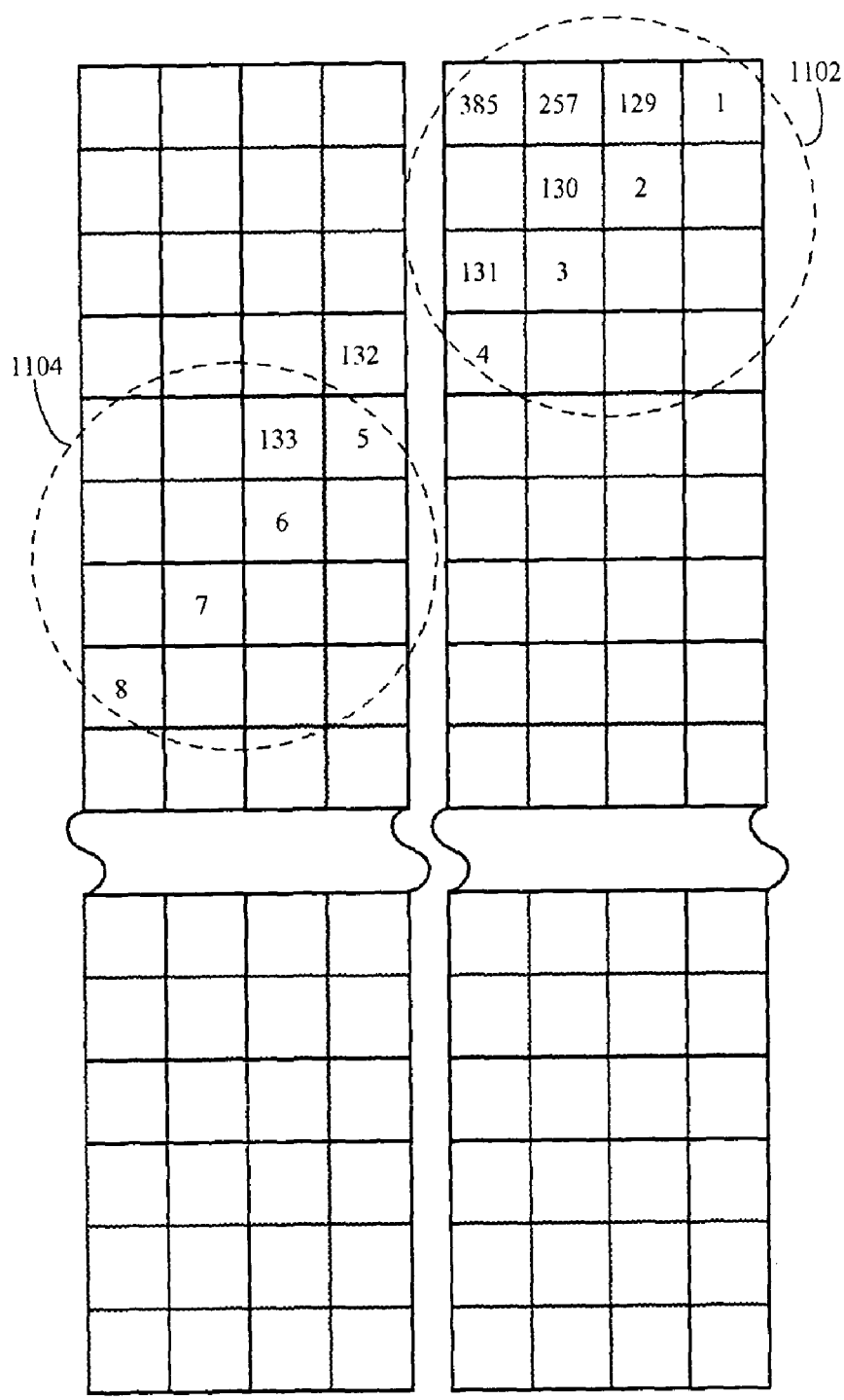
FIG. 11 is a diagram illustrating operation of an UnPacker, according to the invention.

Similarly, the group (labeled 904) of 16 boxes containing groups of symbols 5,6,7,8 in FIG. 9 replicates the group (labeled 704) of 16 boxes at the same row location (rows 5-8) in FIG. 7, as well as the group (labeled 1104) of 16 boxes at the same row location in FIG. 11).

The method of storing dual path Interleaver data by writing the data in a staggered pattern enables a linear read to be done. Further, this gives the advantage of that write address changes are faster than read address changes during a Burst sequence. The data is stored in SRAM such that a linear 32 bit read will provide the data stream that represents the stream from a dual path Interleaver while using a small SRAM. The SRAM is kept small by the staggering as often as possible while maintaining the needed burst length.

UnPacker (510. FIG. 11)

The purpose of the UnPacker 510 is to read 4 sym wide data from SDRAM and provide it as a 1 symbol wide stream to the Un_Sorter 512.

FIG. 11 illustrates an Unpacker. As in FIGS. 7, 8, 9 and 10, each box refers to 16 symbols. (The box marked "1" refers to 16 symbols, etc.)

Writes into the UnPacker 510 are done, row-by-row, from top down, to fill one column. Then, the next column will be filled as rows are filled from the SDRAM.

Reads from the UnPacker are done column-by-column. For example, starting with "129", then "2" . . . will be read.

Figure 12:
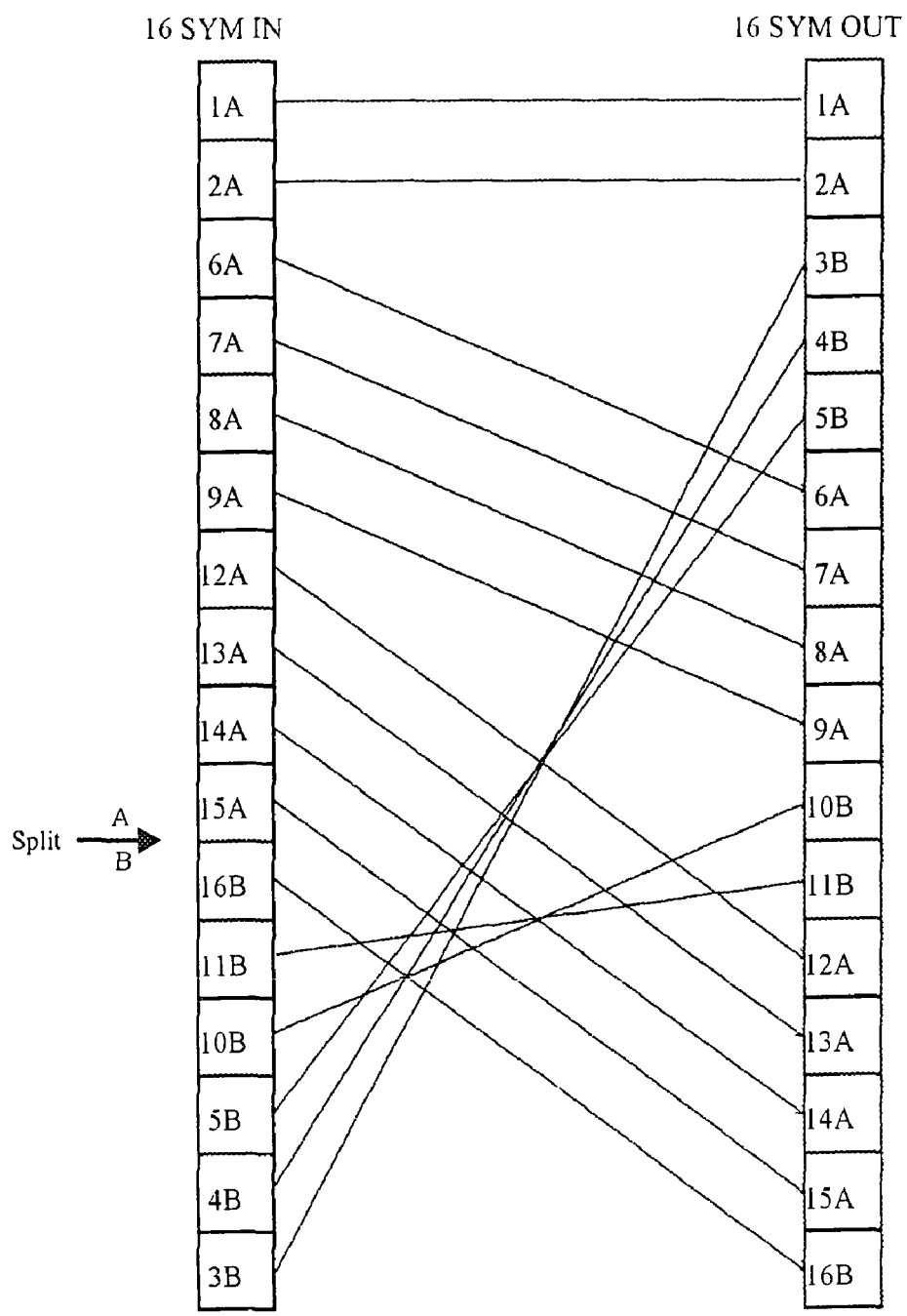
FIG. 12 is a diagram of an UnSorter, according to the invention.

AB_UnSorter (512, FIG. 12)

The Un_Sorter 512 restores the channel order of the stream. This last phase of the Interleaver will remove all traces of the AB_Sorter optimization in the Interleaver. Generally speaking, FIG. 12 (UnSorter) is simply the "mirror image" of FIG. 6 (Sorter). For reading SDRAM, as for writing, there is only one A/B split, as noted in the figure.

It should be understood that the present invention can be realized in the form of control logic, implemented in software or hardware or a combination of both, as will be apparent to one of ordinary skill in the art, based on the teachings set forth herein.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; and many modifications and variations are possible in view of the above teachings. The embodiments were chosen and described in order to best explain the principles of the invention and its practical applications to others skilled in the art, who will be able to understand how to best utilize the invention and various embodiments with various modifications as are suited to the particular use contemplated. It is intended that the following claims and their equivalents define the scope of the invention.

What is claimed is:

1. A method of interleaving data comprising:
   receiving a plurality of symbols from two data paths, each data path associated with a different type of data;
   sorting the symbols to group them according to the type of data they represent;
   packing the sorted symbols in a first memory of an interleaver to accumulate full burst blocks of data that can be accommodated by a second memory of said interleaver, with each full burst block containing only one of the data types; and burst writing the accumulated full burst blocks of data to said second memory.

2. The method of claim 1, wherein:
said first memory comprises SRAM and said second memory comprises SDRAM, the size of said SRAM being substantially smaller than the size of said SDRAM.

3. The method of claim 2, wherein:
after sorting, there is only one break in a sequential write address for each full block to be written into said second memory of said interleaver.

4. The method of claim 1, wherein:
after sorting, there is only one break in a sequential write address for each full block to be written into said second memory of said interleaver.

5. The method of claim 1, further comprising:
providing a plurality of symbol channels.

6. A method of interleaving data comprising:
providing two interleaver data paths, each path associated with a different type of data;
packing symbols from said data paths in a first memory of an interleaver to accumulate sorted blocks of data having a full burst length that can be accommodated by a second memory of said interleaver, with each block only containing data from a respective one of the data paths; and
burst writing the accumulated full blocks of data to said second memory, each full block being written to the second memory in a sequential burst.

7. The method of claim 6, wherein:
said second memory is SDRAM;
the symbols are 8 bit FEC symbols;
said packing step accumulates data for four FEC symbols at a time; and
data is written 32 bits at a time to said SDRAM.

8. The method of claim 6, wherein:
prior to packing, the symbols are sorted to minimize a number of write address breaks required to write data into said second memory.

9. A method of interleaving data comprising:
storing dual path Interleaver data in an interleaver SDRAM, wherein each of said dual paths is associated with a different type of data, by:
first writing the data in a staggered pattern in SRAM of said interleaver such that a linear read can be done from said SRAM, said staggered pattern alternating between data from one of said dual paths and data from the other of said dual paths; and
subsequently writing blocks of the data from said SRAM to said SDRAM in bursts, wherein said blocks are organized to minimize the number of write accesses required by said bursts.

10. The method of claim 9, further comprising:
restarting the staggering within a commutator loop to keep the SRAM small while maintaining the structure of said interleaver and the burst write feature to the SDRAM.

11. The method of claim 9, wherein:
the data is stored in the SDRAM such that a linear 32 bit read will provide he a data stream that represents the stream from said interleaver.

12. A method of interleaving data comprising:
providing a plurality of symbols on two data paths, each data path associated with a different type of data;
sorting the symbols to group them according to the type of data they represent;
packing the sorted symbols in SRAM of an interleaver as burst blocks adapted to minimize the number of write accesses required to subsequently write the burst blocks into SDRAM; and
burst writing the burst blocks from said SRAM to said SDRAM;
wherein, after said sorting step, there is only one break in a write address for writing the burst blocks into SDRAM;
further comprising:
before writing to SDRAM, accumulating data for four FEC symbols at a time; and
writing four symbols wide to optimize SDRAM access time;
wherein:
the FEC symbols are 8 bits;
data is written 32 bits at a time to SDRAM to fit the SDRAM interface, and
data is written to SDRAM in a staggered pattern from said SRAM such that a linear read can be done to gain speed.

13. The method of claim 12, further comprising:
restarting the staggered pattern within a commutator loop to keep the SRAM small while maintaining the structure of said interleaver and the burst write feature to the SDRAM.

14. A method of interleaving data comprising:
receiving a plurality of symbols, wherein each of the symbols is assigned to one of two paths each associated with a different type of data; and
sorting the symbols so that all of the symbols assigned to one of the two paths are grouped together, and all of the symbols assigned to another of the two paths are grouped together; and
using SRAM, packing the sorted symbols in a staggered pattern of burst blocks so that data can be burst written to SDRAM;
wherein said burst blocks are of a size adapted to optimize the efficient writing of data to said SDRAM.

15. The method of claim 14, further comprising:
when the SRAM has a full block corresponding to a SDRAM burst block, performing a full length burst write from SRAM to SDRAM.

16. Apparatus for interleaving data comprising:
means for sorting symbols which are assigned to one of two paths, each path associated with a different type of data, and grouping the symbols so that symbols which are assigned to one of the two paths are grouped together and symbols which are assigned to the other of the two paths are grouped together;
means for storing the sorted symbols in a staggered pattern so that data can be subsequently burst written to SDRAM; and
means for burst writing the symbols to SDRAM.

17. The apparatus of claim 16, wherein:
the means for storing the sorted symbols in a staggered pattern comprises SRAM.

* * * * *